United States Patent
Tao et al.

(10) Patent No.: US 9,430,607 B2
(45) Date of Patent: Aug. 30, 2016

(54) ELECTRON BEAM DRAWING APPARATUS, ELECTRON BEAM DRAWING METHOD, AND STORAGE MEDIUM

(71) Applicant: NIPPON CONTROL SYSTEM CORPORATION, Tokyo (JP)

(72) Inventors: Takuya Tao, Yokohama (JP); Masakazu Hamaji, Yokohama (JP)

(73) Assignee: NIPPON CONTROL SYSTEM CORPORATION, Tokyo (JP)

( * ) Notice: Subject to any disclaimer, the term of this patent is extended or adjusted under 35 U.S.C. 154(b) by 0 days.

(21) Appl. No.: 14/406,641

(22) PCT Filed: Dec. 6, 2013

(86) PCT No.: PCT/JP2013/082771
§ 371 (c)(1),
(2) Date: Dec. 9, 2014

(87) PCT Pub. No.: WO2014/167750
PCT Pub. Date: Oct. 16, 2014

(65) Prior Publication Data
US 2015/0178439 A1 Jun. 25, 2015

(30) Foreign Application Priority Data
Apr. 11, 2013 (JP) ................. 2013-083377

(51) Int. Cl.
*G03F 1/78* (2012.01)
*G06F 17/20* (2006.01)
(Continued)

(52) U.S. Cl.
CPC ............. *G06F 17/5081* (2013.01); *G03F 1/78* (2013.01); *G03F 7/20* (2013.01); *H01J 37/3026* (2013.01); *H01J 37/3174* (2013.01); *H01J 2237/31764* (2013.01)

(58) Field of Classification Search
None
See application file for complete search history.

(56) References Cited

U.S. PATENT DOCUMENTS 5,206,517 A    4/1993  Shibata et al.
5,371,373 A *  12/1994 Shibata ............... H01J 37/3026
                                          250/398
(Continued)

FOREIGN PATENT DOCUMENTS

EP    0382249 A2    8/1990
JP    H06140311 A   5/1994
(Continued)

OTHER PUBLICATIONS

Frisken et al. "Adaptively Sampled Distance Fields: A General Representation of Shape for Computer Graphics" Mitsubishi Electric Research Laboratories. (2000).*
(Continued)

*Primary Examiner* — Michael Logie
(74) *Attorney, Agent, or Firm* — Troutman Sanders LLP

(57) ABSTRACT

An electron beam drawing apparatus includes: an accepting unit that accepts input graphic information, which is information representing at least one graphic; a graphic width acquiring unit that acquires a width of each of the at least one graphic represented by the input graphic information; a generating unit that generates approximate graphic information representing at least one approximate graphic, which is a graphic configured by at least one rectangle matching the width of the graphic, and is a graphic that approximates each of the at least one graphic represented by the input graphic information; and a drawing unit that draws the at least one approximate graphic represented by the approximate graphic information generated by the generating unit.

6 Claims, 22 Drawing Sheets

(51) Int. Cl.
*G06F 17/50* (2006.01)
*G03F 7/20* (2006.01)
*H01J 37/317* (2006.01)
*H01J 37/302* (2006.01)

(56) References Cited

U.S. PATENT DOCUMENTS

| | | | | |
|---|---|---|---|---|
| 5,935,744 | A * | 8/1999 | Nakajima | B82Y 10/00 |
| | | | | 430/296 |
| 6,396,492 | B1 * | 5/2002 | Frisken | G06T 17/00 |
| | | | | 345/420 |
| 6,415,432 | B1 * | 7/2002 | Saito | H01J 37/3026 |
| | | | | 250/492.22 |
| 7,810,066 | B2 | 10/2010 | Yasuzato | |
| 8,017,286 | B2 | 9/2011 | Fujimura et al. | |
| 2002/0175298 | A1 * | 11/2002 | Moniwa | G03F 1/20 |
| | | | | 250/492.22 |
| 2008/0149859 | A1 * | 6/2008 | Yasuzato | B82Y 10/00 |
| | | | | 250/492.22 |
| 2009/0027396 | A1 * | 1/2009 | Frisken | G06T 11/203 |
| | | | | 345/442 |
| 2010/0055587 | A1 | 3/2010 | Fujimura et al. | |
| 2012/0329289 | A1 | 12/2012 | Fujimura et al. | |
| 2013/0205264 | A1 * | 8/2013 | Fujimura | G03F 1/00 |
| | | | | 716/53 |
| 2013/0283216 | A1 * | 10/2013 | Pearman | G03F 1/36 |
| | | | | 716/52 |
| 2014/0245240 | A1 * | 8/2014 | Tiphine | H01J 37/3026 |
| | | | | 716/53 |

FOREIGN PATENT DOCUMENTS

| | | |
|---|---|---|
| JP | 9-298145 | 11/1997 |
| JP | 10-335469 | 12/1998 |
| JP | 2002260982 A | 9/2002 |
| JP | 2008-096486 | 4/2008 |
| JP | 2009-58860 | 3/2009 |
| JP | 2011-071393 | 4/2011 |
| JP | 2012-501476 | 1/2012 |
| JP | 2013-503486 | 1/2013 |
| WO | 2010/025061 | 3/2010 |
| WO | 2014127850 A1 | 8/2014 |

OTHER PUBLICATIONS

European Patent Office, Extended Search Report, counterpart PCT/JP2013082771, mailed Feb. 12, 2015, 9 pages.

* cited by examiner

| 0 | 0 | 0 | 0 | 0 | 0 | ··· | 0 | 0 | 0 | 0 | 0 | 0 |
|---|---|---|---|---|---|---|---|---|---|---|---|---|
| 0 | 0 | 0 | 0 | 0 | 0 | ··· | 0 | 0 | 0 | 0 | 0 | 0 |
| 0 | 0 | 0 | 0 | 0 | 0 | ··· | 0 | 0 | 0 | 0 | 0 | 0 |
| 0 | 0 | 0 | 0 | 0 | 0 | ··· | 0 | 0 | 0 | 1 | 1 | 1 |
| 0 | 0 | 0 | 0 | 0 | 0 | ··· | 0 | 0 | 1 | 2 | 2 | 2 |
| 0 | 0 | 0 | 0 | 0 | 0 | ··· | 0 | 1 | 2 | 3 | 3 | 3 |
| . | . | . | . | . | . |  | . | . | . | . | . | . |
| . | . | . | . | . | . |  | . | . | . | . | . | . |
| . | . | . | . | . | . |  | . | . | . | . | . | . |
| 0 | 0 | 0 | 0 | 0 | 0 | ··· | 90 | 88 | 86 | 84 | 82 | 80 |
| 0 | 0 | 0 | 0 | 0 | 1 | ··· | 88 | 90 | 88 | 86 | 84 | 82 |
| 0 | 0 | 0 | 0 | 1 | 2 | ··· | 86 | 88 | 90 | 88 | 86 | 84 |
| 0 | 0 | 0 | 1 | 2 | 3 | ··· | 84 | 86 | 88 | 90 | 88 | 86 |
| 0 | 0 | 0 | 1 | 2 | 3 | ··· | 82 | 84 | 86 | 88 | 90 | 88 |
| 0 | 0 | 0 | 1 | 2 | 3 | ··· | 80 | 82 | 84 | 86 | 88 | 90 |

FIG.10

ELECTRON BEAM DRAWING APPARATUS, ELECTRON BEAM DRAWING METHOD, AND STORAGE MEDIUM

CROSS-REFERENCE TO RELATED APPLICATIONS

This is a U.S. national phase application under 35 U.S.C. §371 of International Patent Application No. PCT/JP2013/082771, filed on Dec. 6, 2013, and claims benefit of priority to Japanese Patent Application No. JP 2013-083377, filed on Apr. 11, 2013. The entire contents of these applications are hereby incorporated by reference.

TECHNICAL FIELD

The present invention relates to an electron beam drawing apparatus and the like for performing electron beam lithography.

BACKGROUND ART

Conventionally, electron beam drawing apparatuses and the like for performing electron beam lithography have been developed. See, for example, JP 2013-503486A (Tokuhyo) and JP 2012-501476A (Tokuhyo).

Photomasks are used in lithography processes in the manufacture of semiconductors. As the fineness of photomasks recently increases, modification of patterns and addition of auxiliary patterns are often performed using resolution enhancement technique (RET) such as optical proximity correction (OPC). A mask pattern produced by inverse lithography (ILT) which is a type of RET is configured by curved lines.

Currently, photomasks are produced by a drawing machine using electron beams according to the variable shaped beam (VSB) method. However, drawing with electron beams according to the VSB method is applicable only to rectangles with variable size. Thus, a curved line portion is drawn using approximation. According to conventional methods, after a curved line is divided into trapezoids, each trapezoid is approximated into a rectangle. Accordingly, the number of rectangles increases, and the mask drawing time becomes long.

SUMMARY

An aspect of the present invention is directed to an electron beam drawing apparatus, including: an accepting unit that accepts input graphic information, which is information representing at least one graphic; a graphic width acquiring unit that acquires a width of each of the at least one graphic represented by the input graphic information; a generating unit that generates approximate graphic information representing at least one approximate graphic, which is a graphic configured by at least one rectangle matching the width of the graphic, and is a graphic that approximates each of the at least one graphic represented by the input graphic information; and a drawing unit that draws the at least one approximate graphic represented by the approximate graphic information generated by the generating unit.

With this configuration, it is possible to reduce the total number of rectangles at the time of fracturing, and to shorten the drawing time.

An electron beam drawing apparatus and the like according to the present invention can reduce the total number of rectangles at the time of fracturing, and shorten the drawing time.

BRIEF DESCRIPTION OF DRAWINGS

FIG. 10 is a view showing an exemplary distance map in the Embodiment.

DETAILED DESCRIPTION

Figure 1:
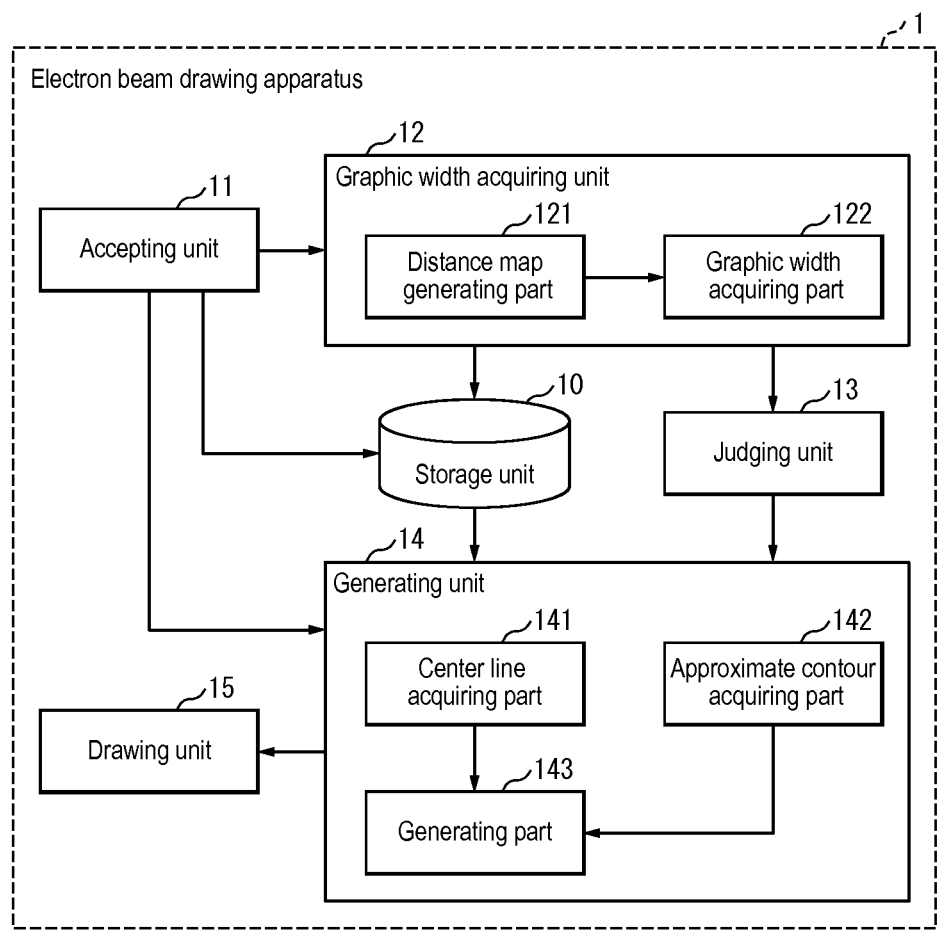
FIG. 1 is a block diagram of an electron beam drawing apparatus 1 in Embodiment.

Hereinafter, embodiments and examples of an electron beam drawing apparatus and the like will be described with reference to the drawings. Note that constituent elements denoted by the same reference numerals perform the same operations in the embodiments and examples, and, thus, a description thereof may not be repeated. The formats, the contents, and the like of each piece of information described in the embodiments and examples are merely an example, and the formats, the contents, and the like are not limited thereto as long as meanings of each piece of information can be represented.

Embodiment

In this Embodiment, an electron beam drawing apparatus 1 will be described. The electron beam drawing apparatus 1 uses input graphic information representing one or more graphics, and rectangles, to generate approximate graphic information representing one or more graphics that approximate the one or more graphics. Then, the electron beam drawing apparatus 1 draws the one or more graphics represented by the approximate graphic information.

FIG. 1 is a block diagram of the electron beam drawing apparatus 1 in this Embodiment. The electron beam drawing apparatus 1 includes a storage unit 10, an accepting unit 11, a graphic width acquiring unit 12, a judging unit 13, a generating unit 14, and a drawing unit 15. Furthermore, the graphic width acquiring unit 12 includes a distance map generating part 121 and a graphic width acquiring part 122. Furthermore, the generating unit 14 includes a center line acquiring part 141, an approximate contour acquiring part 142, and a generating part 143.

The input graphic information is information representing one or more graphics that the user wants the electron beam drawing apparatus 1 to draw. There is no limitation on the shape of each graphic. The shape of the graphic is typically an elongated shape such as a line or a bar, a round shape such as a circle or an ellipse, or the like. Furthermore, the shape of the graphic may be, for example, a shape obtained by combining the elongated shape and the round shape. Furthermore, the graphic typically has a so-called curved line. Furthermore, the graphic is typically referred to as a drawing pattern, a mask pattern, or the like.

Furthermore, the input graphic information typically has one or more coordinate assemblies each having at least one or more sets of coordinates. One coordinate assembly typically represents a contour of one graphic. That is to say, for example, in the case of representing two or more graphics, the input graphic information typically has two or more coordinate assemblies. Furthermore, one or more sets of coordinates contained in a coordinate assembly typically have the order of points forming the contour. Typically, the number of sets of coordinates contained in a coordinate assembly is preferably three or more. There is no limitation on the level of precision of the contour represented by the coordinate assembly. That is to say, it is sufficient that the one or more sets of coordinates typically can represent the contour of each of the one or more graphics at given intervals. Furthermore, the coordinate assembly may be associated, for example, with a graphic identifier for identifying a graphic.

For example, in the case of representing one rectangle, the graphic information may have, for example, a coordinate assembly having the coordinates of four vertices of the rectangle. Alternatively, in this case, the graphic information may have, for example, a coordinate assembly having the coordinates of endpoints of four sides (straight lines) of the rectangle. Alternatively, in this case, the graphic information may have, for example, a coordinate assembly having the coordinates of one vertex as a reference, and information indicating a lateral width and a longitudinal width.

There is no limitation on the data format of the input graphic information. The data format of the input graphic information is typically a data format referred to as mask design data, layout design data, or the like. Specific examples of the data format of the input graphic information include GDS-2, OASIS, and MEBES. Furthermore, the input graphic information may be a so-called image. The data format of the image is typically bitmap.

Furthermore, the approximate graphic information is information representing an approximate graphic, which is a graphic that is to be actually drawn by the electron beam drawing apparatus 1. That is to say, the approximate graphic is typically a graphic in which each of the one or more graphics represented by the input graphic information is divided into rectangles through so-called fracturing. In other words, the approximate graphic is typically a graphic that approximates each of the one or more graphics represented by the input graphic information. The approximate graphic is typically configured by one or more rectangles.

Each of the one or more rectangles forming the approximate graphic typically has a size that is the maximum shot size or smaller, but there is no limitation to this. The maximum shot size is the size of a largest rectangle that can be drawn by the electron beam drawing apparatus 1 in a single drawing. Furthermore, the maximum shot size is typically the length in the horizontal direction and the length in the vertical direction of the rectangle. Furthermore, the maximum shot size may be, for example, the length of a diagonal line of the rectangle, the area of the rectangle, or the like. Furthermore, there is no limitation on the unit for the maximum shot size.

Furthermore, each of the one or more rectangles forming the approximate graphic is typically a rectangle configured by horizontal straight lines and vertical straight lines. A horizontal straight line is a straight line in the horizontal direction. A vertical straight line is a straight line in the vertical direction. Furthermore, straight lines forming the rectangle are typically so-called line segments. Furthermore, the horizontal direction is typically a direction parallel to the horizontal axis (x axis) in an orthogonal coordinate system. The vertical direction is typically a direction parallel to the vertical axis (y axis) in an orthogonal coordinate system. The rectangle may be, for example, a graphic having a predetermined shape such as a circle or an ellipse.

Furthermore, the approximate graphic information typically has one or more coordinate assemblies each having at least one or more sets of coordinates. One coordinate assembly typically represents one rectangle. Furthermore, the data format of the approximate graphic information is typically similar to that of the input graphic information.

In the storage unit 10, typically, two or more pieces of pattern management information are stored. The pattern management information is information in which a graphic classification condition and a pattern identifier are associated with each other. The graphic classification condition is a condition for classifying one or more graphics represented by the input graphic information into two or more patterns. Furthermore, the graphic classification condition is typically a condition regarding a graphic width. The pattern identifier is information for identifying a graphic pattern. A pattern identified with the pattern identifier is typically a pattern based on the graphic width. Furthermore, the number of patterns is typically two or more, and the patterns are determined in advance.

The graphic classification condition is, for example, a condition that the graphic width is a predetermined threshold value or smaller, that the graphic width is larger than a predetermined threshold value, that the graphic width is constant, or that the graphic width is not constant. The graphic classification condition may be a combination of one or more of these conditions. The combination is obtained typically by AND operation, but also may be obtained by OR operation.

In the storage unit 10, typically, two pieces of pattern management information are preferably stored. Two patterns identified with pattern identifiers respectively contained in the two pieces of pattern management information are an auxiliary pattern and a main pattern. The auxiliary pattern is typically a graphic pattern whose graphic width is small enough to satisfy the graphic classification condition. The auxiliary pattern is preferably in the shape of a line typically having a constant width. Furthermore, the main pattern is typically a graphic pattern whose graphic width is large enough to satisfy the graphic classification condition. It is preferable that the graphic classification condition for classifying a graphic as the auxiliary pattern and the graphic classification condition for classifying a graphic as the main pattern are typically in a complementary relation.

It is assumed that the two graphic classification conditions are taken as a graphic classification condition A and a graphic classification condition B. In this case, the graphic classification condition A and the graphic classification condition B have two relationships as follows.

(1) If a graphic width satisfies the graphic classification condition A, it does not satisfy the graphic classification condition B.

(2) If a graphic width satisfies the graphic classification condition B, it does not satisfy the graphic classification condition A.

For example, it is assumed that a graphic classification condition associated with a pattern identifier for identifying the auxiliary pattern is "width ≤20". This graphic classification condition means that the graphic width is "20" or smaller. In such a case, a graphic classification condition associated with a pattern identifier for identifying the main pattern is typically "width >20". This graphic classification condition means that the graphic width is larger than "20".

Furthermore, the maximum shot size may be stored in the storage unit 10. The maximum shot size is typically information indicating the maximum shot size. Furthermore, if the maximum shot size is stored in the storage unit 10, pattern identifiers for identifying two patterns as follows are typically stored in the storage unit 10.

(1) First main pattern: Pattern of a graphic corresponding to the main pattern and having a graphic size that is larger than the maximum shot size (2) Second main pattern: Pattern of a graphic corresponding to the main pattern and having a graphic size that is the maximum shot size or smaller The graphic size is typically the length in the horizontal direction and the length in the vertical direction of a rectangle that circumscribes a graphic and that is configured by horizontal straight lines and vertical straight lines. Furthermore, the graphic size may be, for example, the length of a diagonal line of the rectangle, the area of the rectangle, or the like. The straight lines forming the rectangle that circumscribes a graphic may be, for example, straight lines at a predetermined angle. The predetermined angle is typically an angle with respect to the horizontal direction. Alternatively, the predetermined angle may be, for example, an angle with respect to the vertical direction.

Furthermore, the storage unit 10 is preferably a non-volatile storage medium, but may be realized also by a volatile storage medium. There is no limitation on the procedure in which predetermined information is stored in the storage unit 10 and the like. For example, the predetermined information may be stored in the storage unit 10 and the like via a storage medium, a communication line, an input device, or the like.

The accepting unit 11 accepts input graphic information. Furthermore, the accepting unit 11 may accept, for example, a graphic width, a maximum shot size, or the like. The accepting unit 11 typically accumulates the accepted graphic width, maximum shot size, or the like in the storage unit 10. In the case of accumulating a graphic width, the accepting unit 11 typically accumulates the graphic width as the graphic classification condition.

Furthermore, the accepting unit 11 may accept, for example, auxiliary pattern identifying information, which is information representing a graphic corresponding to the auxiliary pattern, from among one or more graphics represented by the input graphic information. The auxiliary pattern identifying information typically has a graphic identifier for identifying a graphic corresponding to the auxiliary pattern. The accepting unit 11 typically accumulates the accepted auxiliary pattern identifying information in the storage unit 10.

The accepting is a concept that encompasses acquiring information input from an input device such as a touch panel or a keyboard, acquiring information stored in a storage medium such as an optical disk, a magnetic disk, or a semiconductor memory, and receiving information transmitted via a wired or wireless communication line.

The accepting unit 11 may accept information, an instruction, or the like through any input means such as a menu screen, a keyboard, or the like. The accepting unit 11 may be realized by control software for a menu screen, or a device driver for input means such as a keyboard, for example.

The graphic width acquiring unit 12 acquires the width of each of the one or more graphics represented by the input graphic information (hereinafter, referred to as "graphic width" as appropriate), using the input graphic information. The acquiring the graphic width is typically acquiring information indicating the graphic width.

The graphic width is typically the length of a short side forming a rectangle that circumscribes a graphic, but also may be the length of a long side forming the rectangle. The rectangle is typically a rectangle having the smallest size among the one or more rectangles that circumscribe a graphic. The size in this case is typically the area.

Furthermore, the graphic width may be, for example, the distance between width defining points. The width defining points are a pair of two points, among points forming the contour of the graphic. Furthermore, the distance between the width defining points is the distance between the two points. The two points are typically intersections between a width defining straight line and the contour of the graphic. Furthermore, the width defining straight line is typically a straight line parallel to short sides forming a rectangle that circumscribes the graphic. Alternatively, the width defining straight line may be, for example, a horizontal straight line, a vertical straight line, or a straight line parallel to other directions.

Furthermore, the graphic width may be, for example, a group of distances between two or more width defining points. The graphic width also may be an average of the distances between two or more width defining points. In these cases, the number of width defining straight lines is two or more. Furthermore, it is preferable that an interval between the two or more width defining straight lines is typically "1".

Figure 2:
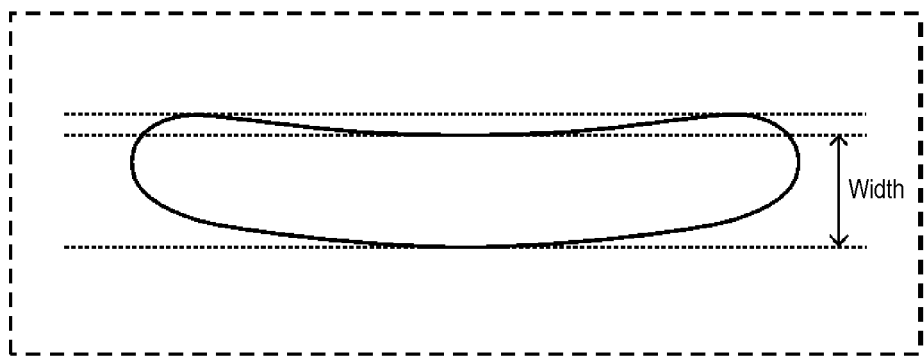
FIG. 2 is a view showing an exemplary graphic width in the Embodiment.
Figure 3:
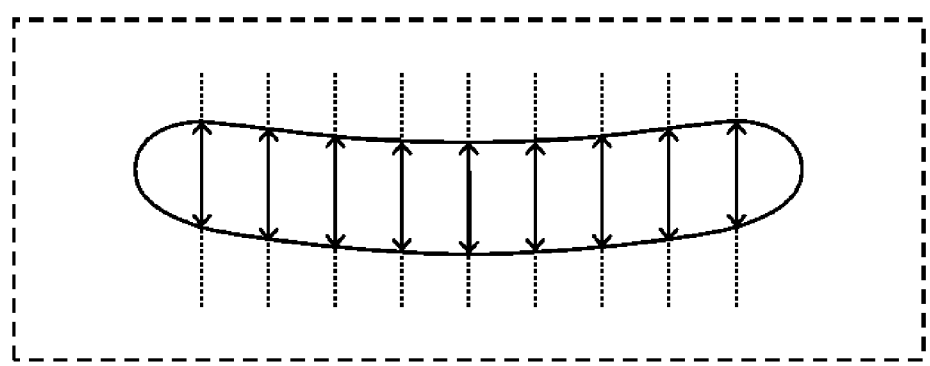
FIG. 3 is a view showing an exemplary graphic width in the Embodiment.
Figure 20:
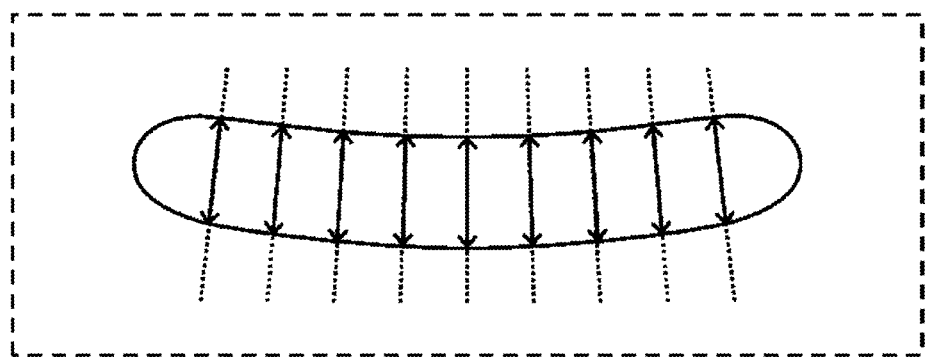
FIG. 20 is a view showing an exemplary graphic width in the Another Embodiment.

For example, it is assumed that a graphic is in the shape of a line elongated in the horizontal direction. Furthermore, it is assumed that a rectangle configured by horizontal straight lines and vertical straight lines, among the one or more rectangles that circumscribe the graphic, is a rectangle having the smallest size. In this case, the graphic width is typically the length of a side in the vertical direction of the rectangle that circumscribes the graphic. Furthermore, for example, as shown in FIG. 2, the graphic width may be the distance between the straight line at the lower edge and the second straight line from the top, among two or more straight lines in the horizontal direction that inscribe or circumscribe the graphic. Furthermore, for example, as shown in FIG. 3, the graphic width may be a group of distances between two or more width defining points, which are distances between two points where two or more width defining straight lines intersect the contour. Furthermore, the two or more width defining straight lines may have different directions, for example, as shown in FIG. 20. Furthermore, the graphic width also may be, for example, an average of the distances between two or more width defining points.

Note that the graphic width acquiring unit 12 acquires the width of each of the one or more graphics, typically using units described later.

The distance map generating part 121 generates a distance map. The distance map is information, on one graphic, representing a group of one or more distances from each of one or more points forming a center line of the graphic to the contour of the graphic. The distance is typically the shortest distance. Furthermore, the point is typically represented by one set of coordinates.

Furthermore, the center line of a graphic is typically a line formed by one or more midpoints between the width defining points. The midpoint between the width defining points is a midpoint between two points that are the width defining points.

Furthermore, the distance map may have, for example, a distance from a point, other than the one or more points forming the center line, to the contour of the graphic. This point is typically a point inside the graphic. Furthermore, the distance map may be, for example, information corresponding to each of the one or more graphics represented by the input graphic information, or may be information corresponding to all of the one or more graphics. There is no limitation on the data structure of the distance map.

The distance map generating part 121 generates a distance map typically using the input graphic information. There is no limitation on the method, the procedure, and the like, as long as the distance map generating part 121 generates a distance map using the input graphic information. Typically, the distance map generating part 121 acquires a center line of a graphic, and generates a distance map using the center line. Note that the acquiring a center line is acquiring a coordinate assembly representing the center line.

The distance map generating part 121 generates a distance map, for example, using one of the following methods.

(A) Method generating a bitmap image (B) Method not generating a bitmap image

The method (A) is a method for generating a distance map, using an image in the bitmap format showing each of one or more graphics represented by the input graphic information (hereinafter, referred to as "bitmap image" as appropriate). In this method, for example, a specific procedure for generating a distance map corresponding to one graphic represented by the input graphic information is, for example, as follows.

(1) The distance map generating part 121 generates, using the input graphic information, a bitmap image showing one graphic represented by the input graphic information.

(2) The distance map generating part 121 acquires, using the bitmap image generated in (1), one or more sets of coordinates representing one or more points forming the contour of the graphic.

(3) The distance map generating part 121 acquires, using the one or more sets of coordinates acquired in (2), one or more coordinate assemblies representing one or more width defining points. Each of the coordinate assemblies typically has two sets of coordinates.

(4) The distance map generating part 121 acquires, using the one or more coordinate assemblies acquired in (3), one or more sets of coordinates each representing a midpoint between two points represented by two sets of coordinates contained in each of the one or more coordinate assemblies. The acquired one or more sets of coordinates are coordinates representing one or more points forming a center line.

(5) The distance map generating part 121 calculates, using the one or more sets of coordinates acquired in (2) and the one or more sets of coordinates acquired in (4), a distance from a point represented by each of the one or more sets of coordinates forming the center line to the contour.

Note that, if the input graphic information is an image in the bitmap format, the process (1) is not typically performed.

The method, the procedure, and the like for generating a bitmap image in (1) are known, and, thus, a detailed description thereof has been omitted.

In the process (1) above, the distance map generating part 121 may calculate coordinates representing a point between two points forming the contour, for example, by so-called interpolation. The interpolation is, for example, linear interpolation.

The method (B) is a method for generating a distance map using the input graphic information, without generating a bitmap image. That is to say, the method is not typically used if the input graphic information is a bitmap image. In this method, for example, a specific procedure for generating a distance map corresponding to one graphic represented by the input graphic information is, for example, as follows.

(1) The distance map generating part 121 acquires, using the input graphic information, one or more sets of coordinates representing one or more points forming the contour of the graphic.

(2) The distance map generating part 121 acquires, using the one or more sets of coordinates representing the contour acquired in (1), one or more coordinate assemblies representing one or more width defining points. Each of the coordinate assemblies typically has two sets of coordinates.

(3) The distance map generating part 121 acquires, using the one or more coordinate assemblies acquired in (2), one or more sets of coordinates each representing a midpoint between two points represented by two sets of coordinates contained in each of the one or more coordinate assemblies. The acquired one or more sets of coordinates are coordinates representing one or more points forming a center line.

(4) The distance map generating part 121 calculates, using the one or more sets of coordinates acquired in (1) and the one or more sets of coordinates acquired in (3), a distance from a point represented by each of the one or more sets of coordinates forming the center line to the contour.

In the process (1) above, the distance map generating part 121 may calculate coordinates representing a point between two points, for example, by so-called interpolation. The interpolation is, for example, linear interpolation.

The graphic width acquiring part 122 acquires the width of each of the one or more graphics represented by the input graphic information. There is no limitation on the method, the procedure, and the like for acquiring the graphic width.

The graphic width acquiring part 122 acquires the graphic width, for example, using one of the following methods.

(A) Method using the distance map (B) Method not using the distance map

In the method (A), for example, a specific procedure for acquiring the width of one graphic represented by the input graphic information is, for example, as follows.

(1) The graphic width acquiring part 122 acquires, from the distance map, a distance from each of one or more points forming the center line of the graphic to the contour.

(2) The graphic width acquiring part 122 acquires one or more values obtained by doubling each of the one or more distances acquired in (1). The acquired values are the graphic width.

In the process (2) above, the graphic width acquiring part 122 may acquire, for example, an average of the acquired one or more values, as the graphic width. Furthermore, the graphic width acquiring part 122 may acquire, for example, the maximum value or the minimum value of the acquired one or more values, as the graphic width.

In the method (B), for example, a specific procedure for acquiring the width of one graphic represented by the input graphic information is, for example, as follows.

(1) The graphic width acquiring part 122 acquires, from the input graphic information, one or more sets of coordinates representing one or more points forming the contour of the graphic.

(2) The graphic width acquiring part 122 acquires, using the one or more sets of coordinates acquired in (1), one or more coordinate assemblies representing one or more width defining points. Each of the coordinate assemblies typically has two sets of coordinates.

(3) The graphic width acquiring part 122 acquires, using the one or more coordinate assemblies acquired in (2), one or more distances, each of which is a distance between two points represented by two sets of coordinates contained in each of the one or more coordinate assemblies. The acquired one or more distances are the graphic width.

In the process (3) above, the graphic width acquiring part 122 may acquire, for example, an average of the acquired one or more distances, as the graphic width. Furthermore, the graphic width acquiring part 122 may acquire, for example, the maximum distance or the minimum distance of the acquired one or more distances, as the graphic width.

The judging unit 13 judges which, of the two or more patterns based on the graphic width, each of the one or more graphics represented by the input graphic information corresponds to. The judging is typically acquiring a pattern identifier indicating the judgment result.

The judging unit 13 typically judges which, of the two or more graphic classification conditions stored in the storage unit 10, the graphic width acquired by the graphic width acquiring unit 12 satisfies. The judging unit 13 acquires a pattern identifier associated with the graphic classification condition judged as being satisfied. The judging unit 13 judges that the graphic from which the graphic width has been acquired is a pattern that can be identified with the acquired pattern identifier.

For example, it is assumed that the graphic width is "18". Furthermore, it is assumed that the graphic classification condition is "graphic width ≤20". The graphic classification condition means that the graphic width is 20 or smaller. In such a case, the judging unit 13 judges that the graphic width satisfies this graphic classification condition.

Furthermore, for example, it is assumed that one or more graphic widths are "20, 20, 20, 20". Furthermore, it is assumed that the graphic classification condition is "(10 ≤ graphic width ≤30) & (graphic width=constant)". The graphic classification condition means that the graphic width is 10 or larger and 30 or smaller, and that the graphic width is constant. In such a case, the judging unit 13 judges that the one or more graphic widths satisfy this graphic classification condition.

Furthermore, the judging unit 13 typically judges whether or not the graphic size of a graphic judged as being the main pattern is larger than a maximum shot size. In this case, a maximum shot size, a pattern identifier for identifying a first main pattern, and a pattern identifier for identifying a second main pattern are stored in the storage unit 10. For example, if the graphic size is larger than the maximum shot size, the judging unit 13 acquires the pattern identifier for identifying the first main pattern. Furthermore, for example, if the graphic size is the maximum shot size or smaller, the judging unit 13 acquires the pattern identifier for identifying the second main pattern.

In the case of judging whether a graphic is the first main pattern or the second main pattern, the judging unit 13 acquires, for example, a rectangle that circumscribes the graphic judged as being the main pattern. The rectangle is typically a rectangle configured by horizontal straight lines and vertical straight lines. Then, the judging unit 13 judges whether or not the size of the acquired rectangle is larger than the maximum shot size. In that case, the judging unit 13 compares, for example, the size of the rectangle and the maximum shot size, in terms of their lengths in the horizontal direction, their lengths in the vertical direction, the lengths of their diagonal lines, their areas, or the like. If any of the length in the horizontal direction, the length in the vertical direction, the length of the diagonal line, the area, and the like is larger than that of the maximum shot size, the judging unit 13 judges that the graphic size is larger than the maximum shot size.

Note that the graphic size is typically acquired by an unshown graphic size acquiring unit. The graphic size acquiring unit typically acquires the size of each of the one or more graphics represented by the input graphic information, using the input graphic information. The method, the procedure, and the like for acquiring the graphic size are known, and, thus, a detailed description thereof has been omitted.

The generating unit 14 generates approximate graphic information, using the input graphic information. The generating unit 14 typically generates approximate graphic information representing one or more approximate graphics that approximate one or more graphics, using a method that varies according to the pattern identifier acquired by the judging unit 13. Furthermore, the generating unit 14 typically generates approximate graphic information for each of the one or more graphics represented by the input graphic information. Then, the generating unit 14 combines the generated one or more pieces of approximate graphic information into one piece of approximate graphic information.

The generating unit 14 generates approximate graphic information, typically using units described later.

The center line acquiring part 141 acquires a center line of each of the one or more graphics, using the input graphic information. The one or more graphics are typically graphics judged by the judging unit 13 as being the auxiliary pattern. Alternatively, the one or more graphics may be, for example, graphics judged by the judging unit 13 as being the main pattern.

For example, if the distance map generating part 121 has generated a distance map, the distance map generating part 121 has typically acquired a center line of each of the one or more graphics represented by the input graphic information. Accordingly, in this case, the center line acquiring part 141 typically acquires, from the distance map generating part 121, a center line of a graphic corresponding to the auxiliary pattern, from among the center lines acquired during generation of the distance map. Furthermore, for example, if the distance map generating part 121 has not generated a distance map, the center line acquiring part 141 typically acquires a center line of a graphic corresponding to the auxiliary pattern, using the input graphic information. The method, the procedure, and the like for acquiring the center line are similar to those by the distance map generating part 121 for acquiring the center line, and, thus, a description thereof has been omitted.

The approximate contour acquiring part 142 acquires an approximate contour, using the input graphic information. The approximate contour is a contour of each of one or more graphics, and is typically a contour configured by horizontal straight lines and vertical straight lines. Furthermore, the approximate contour may be configured by, for example, straight lines at a predetermined angle. The acquiring an approximate contour is typically acquiring a coordinate assembly representing the approximate contour. Furthermore, the one or more graphics are typically graphics judged by the judging unit 13 as being the main pattern. Hereinafter, the contour of a graphic represented by the input graphic information is referred to as an original contour as appropriate.

The approximate contour acquiring part 142 acquires an approximate contour typically such that a difference between the original contour and the approximate contour is small enough to satisfy a predetermined condition (hereinafter, referred to as "difference condition" as appropriate). The difference between the original contour and the approximate contour is, for example, a difference between the graphic size represented by the original contour and the graphic size represented by the approximate contour, a difference between the length of the original contour and the length of the approximate contour, the number of intersections between the original contour and the approximate contour, or the like. The difference may be, for example, a ratio, a proportion, or the like.

The difference condition is, for example, that the difference is a predetermined threshold value or smaller, or that the difference is within a predetermined range.

That is to say, the approximate contour acquiring part 142 judges, for example, whether or not a difference between the original contour and the approximate contour satisfies the difference condition. For example, if the difference does not satisfy the difference condition, the approximate contour acquiring part 142 enlarges or reduces the graphic represented by the approximate contour such that the difference satisfies the difference condition.

Furthermore, the approximate contour may be, for example, a polygon that inscribes the graphic, a polygon that circumscribes the graphic, or neither of them.

The method, the procedure, and the like for acquiring the approximate contour such that a difference between the original contour and the approximate contour satisfies the difference condition are known, and, thus, a detailed description thereof has been omitted. The method is, for example, quantization. That is to say, for example, the original contour is taken as a so-called analog signal waveform, and the original contour is quantized, so that an approximate contour can be acquired.

The generating part 143 generates approximate graphic information according to the pattern identifier acquired by the judging unit 13. The approximate graphic information is approximate graphic information representing an approximate graphic that approximates a graphic corresponding to a graphic pattern identified with the pattern identifier. The generating approximate graphic information is typically acquiring one or more pieces of coordinate information representing one or more rectangles forming the approximate graphic. Hereinafter, "generate approximate graphic information" is referred to as "generate an approximate graphic" as appropriate. Furthermore, hereinafter, a graphic represented by the input graphic information is referred to as an original graphic as appropriate. The approximate graphic is typically generated, for example, by arranging a rectangle, or dividing a graphic represented by the input graphic information into one or more rectangles, according to a predetermined method or procedure. Furthermore, the graphic pattern identified with the pattern identifier acquired by the judging unit 13 is typically one of the following patterns.

(A) Auxiliary pattern
(B) First main pattern
(C) Second main pattern (A): In this case, typically, the generating part 143 arranges one or more rectangles matching the width of a graphic corresponding to the auxiliary pattern, along a center line of the graphic. With this arrangement, the generating part 143 generates one or more approximate graphics that approximate one or more graphics corresponding to the auxiliary pattern. The arranging a rectangle along a center line is typically arranging the rectangle such that its center is on the center line. Furthermore, the arranging a rectangle along a center line may be, for example, arranging the rectangle such that any one of the four vertices of the rectangle, any one of the four sides forming the rectangle, or the like is on the center line. Furthermore, in the case of arranging rectangles along a center line, the generating part 143 typically arranges the rectangles sequentially from one of the endpoints of the center line toward the other endpoint of the center line. Furthermore, the generating part 143 may arrange, for example, one or more rectangles matching the width of a graphic corresponding to the auxiliary pattern, not along a center line of the graphic.

The rectangle matching the width of a graphic is typically a rectangle in which any one of a short side, a long side, and a diagonal line has a length that is close to the graphic width enough to satisfy a predetermined condition (hereinafter, referred to as "rectangle size condition" as appropriate). The rectangle size condition is typically a condition regarding the size of a rectangle. The size of a rectangle is, for example, any one of the length of a short side of the rectangle, the length of a long side of the rectangle, and the length of a diagonal line of the rectangle. Furthermore, the size of a rectangle that is to be arranged may vary in each arrangement.

Furthermore, in the arrangement, the generating part 143 typically arranges rectangles such that the rectangles do not overlap each other. Note that "such that rectangles do not overlap each other" is typically arranging a rectangle so as to be adjacent to an already arranged rectangle.

Furthermore, in the arrangement, the generating part 143 may arrange rectangles, for example, such that the rectangles overlap each other. Note that "such that rectangles overlap each other" is typically arranging a rectangle such that the size of a portion thereof that overlaps an already arranged graphic satisfies a predetermined condition (hereinafter, referred to as "overlap amount condition" as appropriate). The overlap amount condition is typically a condition regarding the size (area) of an overlap portion of graphics. Furthermore, the overlap amount condition may be, for example, a condition regarding the ratio of the size of the overlap portion with respect to the size of the arranged graphic.

If the overlap amount condition indicates, for example, that the size of an overlap portion of graphics is "0", the generating part 143 typically arranges rectangles such that the rectangles are adjacent to each other.

Furthermore, in the arrangement, the generating part 143 uses, for example, the position of an arranged rectangle, the size of the arranged rectangle, and the like, to determine the position where a rectangle is to be arranged next, the size of the rectangle that is to be arranged, and the like. The position is, for example, the coordinates corresponding to the center of a rectangle, the coordinates corresponding to any one or more of the four vertices of a rectangle, or the like. The position and the size may be calculated, for example, using a predetermined calculation equation. The calculation equation has, for example, variables indicating the lateral width of the rectangle, the longitudinal width of the rectangle, the position of the rectangle, and the like, and other constants.

Furthermore, in the arrangement, the generating part 143 typically generates an approximate graphic such that a difference between the original graphic and the approximate graphic is small enough to satisfy the difference condition. The difference between the original graphic and the approximate graphic is, for example, a difference between the size of the original graphic and the size of the approximate graphic, a difference between the length of the contour of the original graphic and the length of the contour of the approximate graphic, the number of intersections between the contour of the original graphic and the contour of the approximate graphic, or the like. The "difference" may be, for example, a ratio, a proportion, or the like.

That is to say, the generating part 143 judges, for example, whether or not a difference between the original graphic and the approximate graphic satisfies the difference condition. For example, if the difference does not satisfy the difference condition, the generating part 143 again arranges the rectangle, or enlarges or reduces the approximate graphic such that the difference satisfies the difference condition.

It is sufficient that the generating part 143 can generate an approximate graphic such that a difference from the size of a graphic corresponding to the auxiliary pattern is small enough to satisfy the difference condition, by arranging one or more rectangles along the center line of the graphic. There is no limitation on the method, the procedure, and the like for generating the approximate graphic.

(B): In this case, typically, the generating part 143 sequentially arranges one or more rectangles matching the shape of a graphic represented by an approximate contour of a graphic corresponding to the first main pattern. With this arrangement, the generating part 143 generates one or more approximate graphics that approximate one or more graphics corresponding to the first main pattern. The rectangle matching the shape of the graphic represented by the approximate contour is typically a rectangle whose size is smaller than the graphic represented by the approximate contour. Furthermore, the approximate contour is typically an approximate contour acquired by the approximate contour acquiring part 142.

Furthermore, in the arrangement, the generating part 143 typically arranges a rectangle along an approximate contour. Note that "arranging a rectangle along an approximate contour" is typically arranging the rectangle such that the arranged rectangle does not stick out of the approximate contour and is arranged with no gap between the rectangle and the approximate contour.

Furthermore, in the arrangement, the generating part 143 may arrange rectangles, for example, such that the rectangles do not overlap each other or such that the rectangles overlap each other. In the case of arranging rectangles such that the rectangles overlap each other, the generating part 143 typically arranges the rectangles so as to satisfy the overlap amount condition.

Furthermore, in the arrangement, the generating part 143 typically arranges rectangles such that the total number of rectangles is small. The method, the procedure, and the like for arranging rectangles having a size that is a predetermined size or smaller along the contour of a predetermined polygon such that the total number is small are known, and, thus, a detailed description thereof has been omitted. Furthermore, a predetermined polygon herein is a graphic represented by the approximate contour.

(C): In this case, typically, the generating part 143 divides a graphic represented by an approximate contour of a graphic corresponding to the second main pattern, along the approximate contour, into two or more rectangles. Note that "dividing along an approximate contour" is typically dividing such that a straight line that divides a graphic represented by the approximate contour is on a horizontal straight line or a vertical straight line forming the approximate contour. Furthermore, "divide into rectangles" is typically dividing in either the horizontal direction or the vertical direction. With this dividing, the generating part 143 generates one or more approximate graphics that approximate one or more graphics corresponding to the second main pattern.

Furthermore, in this case, the generating part 143 typically divides an approximate contour into two or more rectangles in the horizontal direction or the vertical direction along the approximate contour such that the total number of rectangles is small. The generating part 143, for example, divides a graphic represented by the approximate contour both in the horizontal direction and in the vertical direction, thereby generating two approximate graphics. The generating part 143 acquires an approximate graphic with a smaller number of rectangles obtained by the dividing.

The method, the procedure, and the like for dividing a predetermined polygon in the horizontal direction or the vertical direction along the contour of the polygon such that the total number of rectangles after the dividing is small are known, and, thus, a detailed description thereof has been omitted. Furthermore, a predetermined polygon herein is a graphic represented by the approximate contour.

Furthermore, if the judging unit 13 judges that one graphic represented by the input graphic information is a pattern other than the above-described three patterns, the generating part 143 typically generates approximate graphic information representing an approximate graphic corresponding to the graphic using a predetermined method, procedure, and the like. Hereinafter, the information representing the predetermined method, procedure, and the like is referred to as generating method information as appropriate. The generating method information typically represents an algorithm for generating approximate graphic information. The generating method information is, for example, an execution program for generating approximate graphic information from the input graphic information, source code representing the procedure for generating approximate graphic information from the input graphic information, pseudo program code representing the procedure, a flowchart representing the procedure, or the like. Furthermore, the pseudo program code is an algorithm described like a programming language using a natural language. Furthermore, the pseudo program code typically has a grammar similar to that of an existing programming language.

The drawing unit 15 draws one or more approximate graphics represented by the approximate graphic information generated by the generating unit 14. There is no limitation on an object on which the drawing is to be performed. The drawing is to be performed, for example, on a photomask, a wafer, or the like. Furthermore, the drawing unit 15 may be typically realized by a field emission-type, Schottky-type, or thermionic-type electron gun, an electronic lens, a height detector, or the like. Furthermore, the cross-sectional shape of electron beams emitted by the drawing unit 15 is typically rectangular. Typically, the processing procedure of the drawing unit 15 is realized by software, and the software is stored in a storage medium such as a ROM.

The graphic width acquiring unit 12, the distance map generating part 121, the graphic width acquiring part 122, the judging unit 13, the generating unit 14, the center line acquiring part 141, the approximate contour acquiring part 142, and the generating part 143 may be realized typically by an MPU, a memory, or the like. Typically, the processing procedure of the graphic width acquiring unit 12 and the like is realized by software, and the software is stored in a storage medium such as a ROM. Note that the graphic width acquiring unit 12 and the like may be realized also by hardware (a dedicated circuit).

Figure 4:
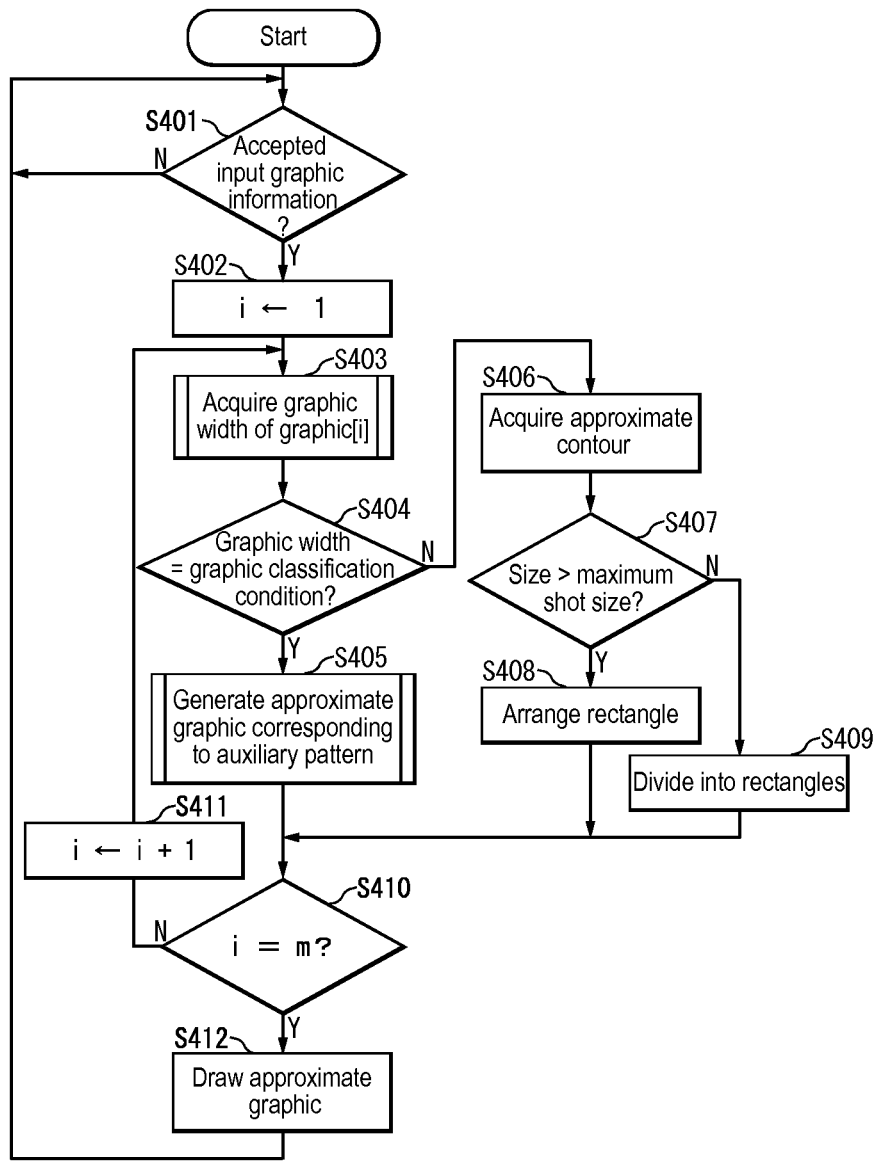
FIG. 4 is a flowchart illustrating the outline of an operation of the electron beam drawing apparatus 1 in the Embodiment.

Next, the outline of an operation of the electron beam drawing apparatus 1 will be described with reference to a flowchart. Note that an i-th piece of information in predetermined information is referred to as "information[i]". FIG. 4 is a flowchart illustrating the outline of an operation of the electron beam drawing apparatus 1.

(Step S401) The graphic width acquiring unit 12 judges whether or not the accepting unit 11 has accepted input graphic information. If accepted, the procedure advances to S402, and, if not, the procedure returns to S401. It is assumed that the input graphic information represents m graphics.

(Step S402) The generating unit 14 sets a counter i to 1.

(Step S403) The graphic width acquiring unit 12 acquires the graphic width of a graphic[i]. This processing will be described in detail with reference to a flowchart in FIG. 5.

(Step S404) The judging unit 13 judges whether or not the graphic width acquired in step S403 satisfies the graphic classification condition. If satisfied, the procedure advances to S405, and, if not, the procedure advances to step S406.

(Step S405) The generating unit 14 generates an approximate graphic corresponding to the graphic[i] corresponding to the auxiliary pattern. This processing will be described in detail with reference to a flowchart in FIG. 6.

(Step S406) The approximate contour acquiring part 142 acquires an approximate contour corresponding to the graphic[i]. (Step S407) The judging unit 13 judges whether or not the size of the graphic[i] is larger than the maximum shot size. If the size is larger than the maximum shot size, the procedure advances to S408, and, if not, the procedure advances to step S409.

(Step S408) The generating part 143 arranges one or more rectangles along the approximate contour acquired in step S406. With this arrangement, the generating part 143 generates an approximate graphic corresponding to the graphic [i].

(Step S409) The generating part 143 divides a graphic represented by the approximate contour acquired in step S406, along the approximate contour, into two or more rectangles. With the dividing, the generating part 143 generates an approximate graphic corresponding to the graphic [i]. (Step S410) The generating unit 14 judges whether or not i is m. If i is m, the procedure advances to S412, and, if not, the procedure advances to step S411.

(Step S411) The generating unit 14 increments i by 1. The procedure returns to S403.

(Step S412) The drawing unit 15 draws the one or more approximate graphics generated in steps S403 to S409.

Note that the process may be terminated by powering off or an interruption at completion of the process in the flowchart in FIG. 4.

Furthermore, in the flowchart in FIG. 4, the process in step S403 may be performed in the unit of m graphics. In this case, the processes in steps S404 to S409 are performed in the unit of m graphics.

Furthermore, in the flowchart in FIG. 4, the process in step S404 is the same as the process in step S404-1 described below.

(Step S404-1) The judging unit 13 acquires, from the storage unit 10, a pattern identifier associated with the graphic classification condition satisfied by the auxiliary width. If a pattern identifier for identifying the auxiliary pattern is acquired, the procedure advances to step S405. If a pattern identifier for identifying the main pattern is acquired, the procedure advances to step S406.

Furthermore, in the flowchart in FIG. 4, the process in step S407 is the same as the process in step S407-1 described below.

(Step S407-1) The judging unit 13 judges whether or not the size of the graphic[i] is larger than the maximum shot size. If the size is larger than the maximum shot size, the judging unit 13 acquires, from the storage unit 10, a pattern identifier for identifying the first main pattern. If the size is not larger than the maximum shot size, the judging unit 13 acquires, from the storage unit 10, a pattern identifier for identifying the second main pattern. If the pattern identifier for identifying the first main pattern is acquired, the procedure advances to step S408. If the pattern identifier for identifying the second main pattern is acquired, the procedure advances to step S409.

Figure 5:
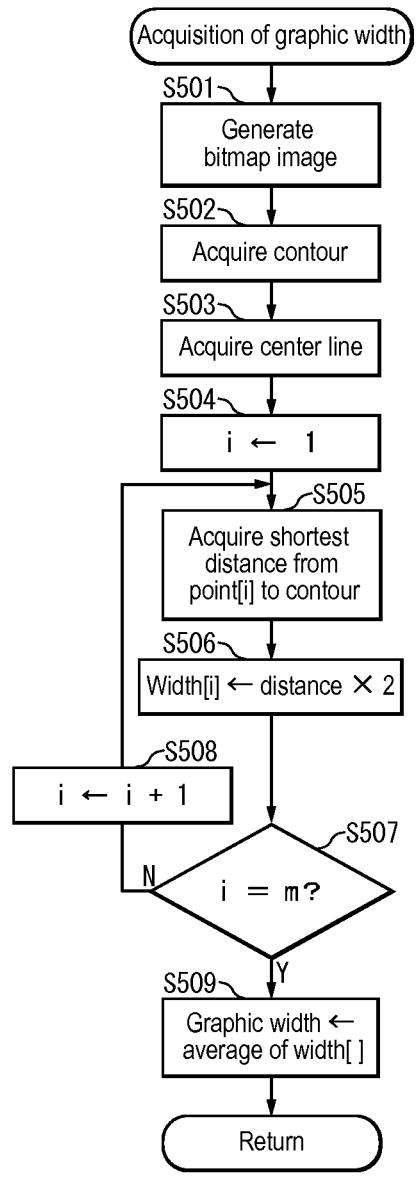
FIG. 5 is a flowchart illustrating a graphic width acquiring process in the Embodiment.

FIG. 5 is a flowchart illustrating the graphic width acquiring process in step S403 of the flowchart in FIG. 4. In the flowchart in FIG. 5, "graphic[i]" in the flowchart in FIG. 4 is referred to as "graphic".

(Step S501) The distance map generating part 121 generates a bitmap image of the graphic, using the input graphic information.

(Step S502) The distance map generating part 121 acquires the contour of the graphic, using the bitmap image generated in step S501.

(Step S503) The distance map generating part 121 acquires a center line of the graphic, using the contour acquired in step S502. It is assumed that the center line is configured by m points.

(Step S504) The distance map generating part 121 sets a counter i to 1.

(Step S505) The distance map generating part 121 acquires the shortest distance from a point[i] to the contour acquired in step S502.

(Step S506) The graphic width acquiring part 122 doubles the distance acquired in step S505, and sets the graphic width[i] at the point[i] to the thus obtained value.

(Step S507) The distance map generating part 121 judges whether or not i is m. If i is m, the procedure advances to S509, and, if not, the procedure advances to step S508.

(Step S508) The distance map generating part 121 increments i by 1. The procedure returns to S505.

(Step S509) The distance map generating part 121 sets the graphic width to an average of the m widths acquired in step S506. The procedure returns to the upper-level processing.

Figure 6:
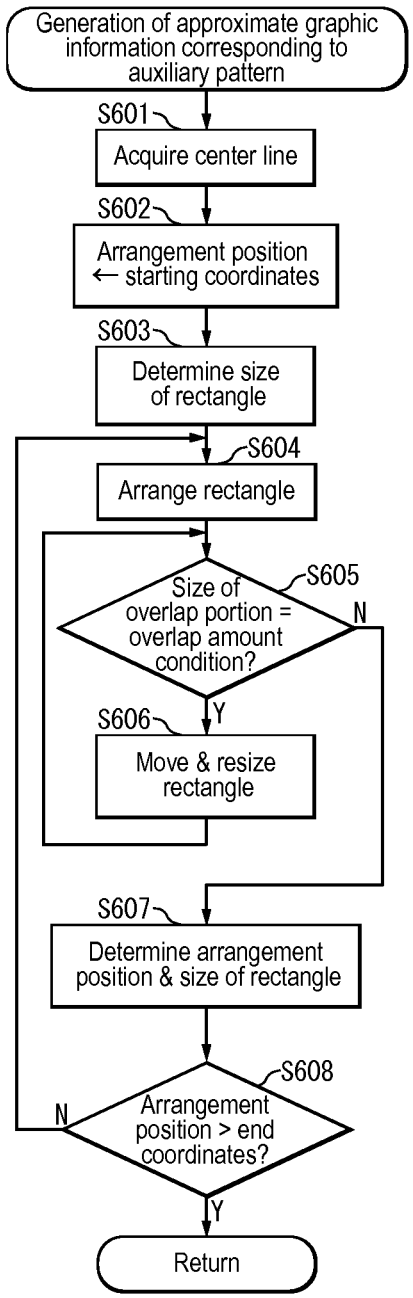
FIG. 6 is a flowchart illustrating an approximate graphic information generating process corresponding to an auxiliary pattern in the Embodiment.

FIG. 6 is a flowchart illustrating the approximate graphic information generating process corresponding to the auxiliary pattern in step S405 of the flowchart in FIG. 4. In the flowchart in FIG. 6, "graphic[i]" in the flowchart in FIG. 4 is referred to as "graphic".

(Step S601) The center line acquiring part 141 acquires the center line of the graphic.

(Step S602) The generating part 143 sets the arrangement position to the starting coordinates of the center line acquired in step S601. The starting coordinates of the center line are the coordinates representing one of the endpoints at both ends of the center line.

(Step S603) The generating part 143 determines the size of a rectangle that is to be arranged, according to the graphic width at the arrangement position.

(Step S604) The generating part 143 arranges the rectangle whose size has been determined in step S603, at the arrangement position.

(Step S605) The generating part 143 judges whether or not the size of a portion where the rectangle arranged in step S604 and an already arranged rectangle overlap each other satisfies the overlap amount condition. If the overlap amount condition is satisfied, the procedure advances to S607, and, if not, the procedure advances to step S606.

(Step S606) The generating part 143 changes the arrangement position or the size of the rectangle arranged in step S604 such that the size of the portion where the rectangle arranged in step S604 and the already arranged rectangle overlap each other satisfies the overlap amount condition.

(Step S607) The generating part 143 determines the position and the size of a rectangle that is to be arranged next, according to the size of the rectangle arranged in step S604, the graphic width at the arranged position in step S604, and the like.

(Step S608) The generating part 143 judges whether or not the arrangement position is beyond the end coordinates of the center line. The end coordinates of the center line are the coordinates representing a point that is not a point represented by the starting coordinates, of the endpoints at both ends of the center line. If the arrangement position is beyond the end coordinates, the procedure returns to the upper-level processing, and, if not, the procedure returns to S604.

SPECIFIC EXAMPLES

Next, specific examples of the operation of the electron beam drawing apparatus 1 will be described.

Example

In this Example, an operation that acquires the graphic width using the distance map will be described.

Figure 7:
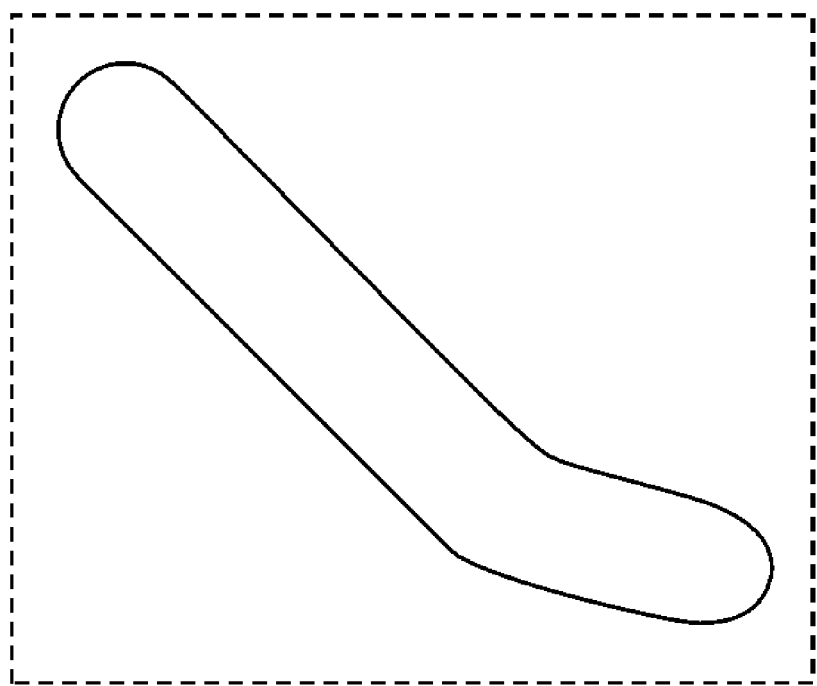
FIG. 7 is a view showing an exemplary graphic in the Embodiment.

First, it is assumed that the accepting unit 11 has accepted input graphic information representing a graphic shown in FIG. 7.

Figure 8:
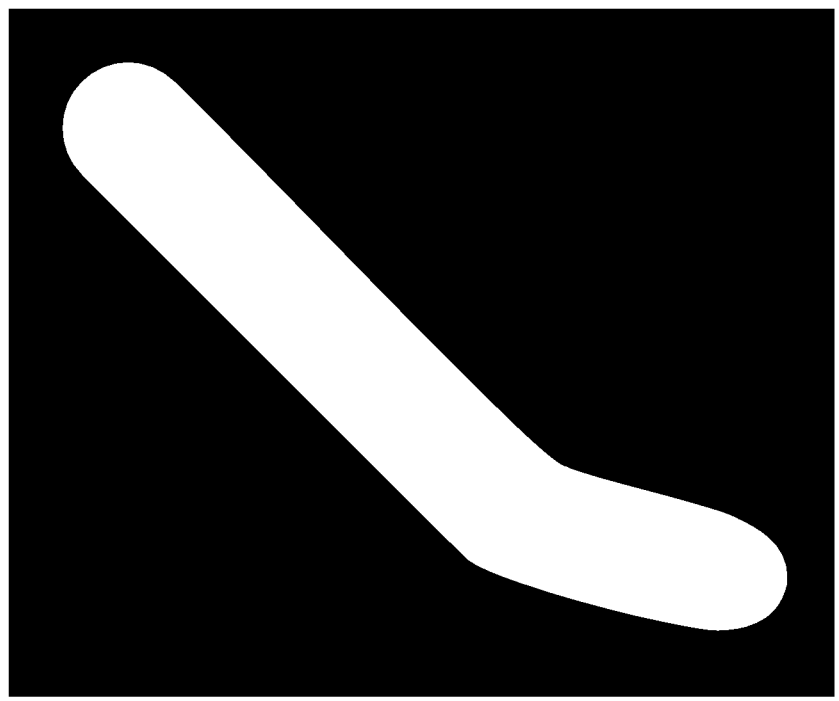
FIG. 8 is a view showing an exemplary bitmap image in the Embodiment.

Next, the distance map generating part 121 generates a bitmap image shown in FIG. 8, using the input graphic information accepted by the accepting unit 11. The bitmap image is an image in which the inside of the graphic in FIG. 7 is "white" and the outside of the graphic is "black".

Next, using the bitmap image in FIG. 8, the distance map generating part 121 acquires a coordinate assembly representing the contour of the graphic represented by the bitmap image. In that case, the distance map generating part 121, for example, detects two pixels configured by a white pixel and a black pixel that are adjacent to each other in the bitmap image in FIG. 8. The distance map generating part 121 acquires one or more sets of coordinates each representing the position of the white pixel. Note that "adjacent to each other" may be the state of being adjacent to each other either in the upper-lower direction or in the left-right direction.

Figure 9:
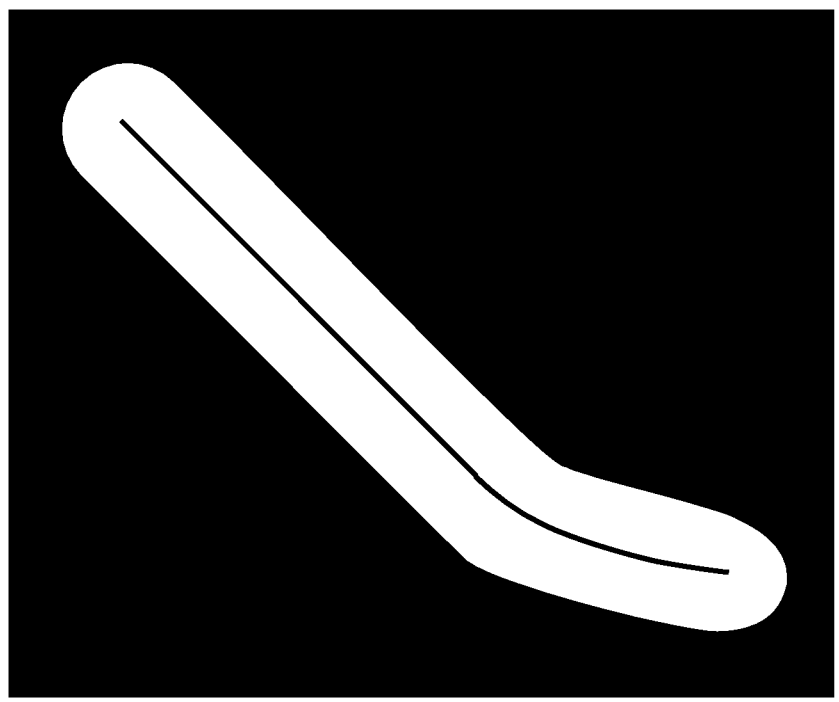
FIG. 9 is a view showing an exemplary center line in the Embodiment.

Next, the distance map generating part 121 calculates an average of y coordinates of two sets of coordinates having the same x coordinate, using the coordinate assembly representing the contour. The distance map generating part 121 acquires one or more sets of coordinates each representing a midpoint between the two sets of coordinates, and acquires a center line shown in FIG. 9.

Next, the distance map generating part 121 calculates a distance from a point represented by each of the one or more sets of coordinates forming the center line to the contour, using the coordinate assembly representing the contour and the coordinate assembly representing the center line. In that case, the distance map generating part 121 calculates, for example, a distance to the contour also from points not on the center line. In that case, the distance map generating part 121 calculates, for example, a distance to the contour from a point outside the graphic in FIG. 7 as "0". As a result, for example, the distance map as shown in FIG. 10 is generated. Each cell in FIG. 10 corresponds to each pixel in the bitmap image in FIG. 8. In FIG. 10, a cell with the value being "0" corresponds to a pixel outside the graphic in FIG. 7, and a cell with the value not being "0" corresponds to a pixel inside the graphic in FIG. 7. Furthermore, in FIG. 10, a cell with the value being "90" corresponds to a pixel (point) forming the center line in FIG. 9.

Next, the graphic width acquiring part 122 acquires, from the distance map in FIG. 10, a distance from each of one or more points forming the center line to the contour. The graphic width acquiring part 122 acquires, for example, a distance "90" from the center line in FIG. 9 to an endpoint at the upper end. Then, the graphic width acquiring part 122 doubles the acquired distance, thereby acquiring a graphic width "180" corresponding to that endpoint.

Furthermore, the graphic width acquiring part 122 typically performs the above-described processing on each of the one or more points forming the center line, thereby acquiring a graphic width corresponding to each of the one or more points.

Another Example

In this Another Example, an operation that acquires the graphic width without using the distance map will be described.

First, it is assumed that the accepting unit 11 has accepted input graphic information representing the graphic shown in FIG. 7, as in Example 1.

Figure 11:
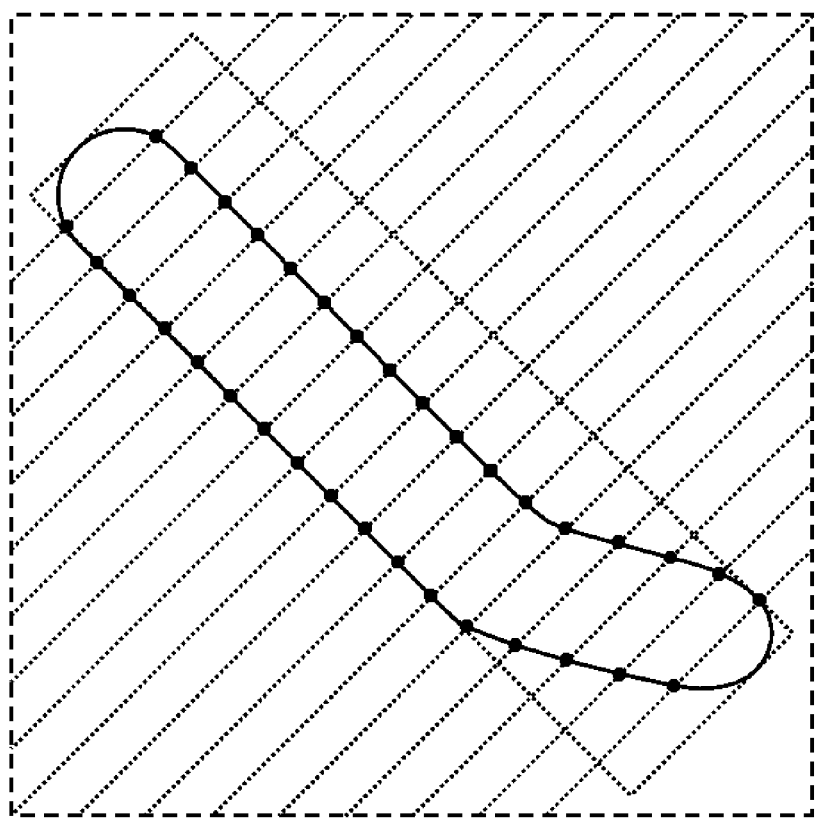
FIG. 11 is a view showing an example of detecting width defining points in the Embodiment.

Next, the graphic width acquiring part 122 detects two or more width defining points that are intersections between two or more straight lines parallel to a short side forming the smallest rectangle that circumscribes the graphic and the contour of the graphic, as shown in FIG. 11. The graphic width acquiring part 122 acquires two or more coordinate assemblies each having two sets of coordinates representing the two or more width defining points. It is assumed that the interval between the two or more straight lines is "1" in FIG. 11.

Next, the graphic width acquiring part 122 calculates a distance between the two points represented by two sets of coordinates contained in each of the acquired one or more coordinate assemblies. The graphic width acquiring part 122 acquires a graphic width corresponding to each of the one or more intersections.

Yet Another Example

In this Yet Another Example, an operation that generates an approximate graphic corresponding to a graphic corresponding to the auxiliary pattern will be described. In this Yet Another Example, it is assumed that the graphic corresponding to the auxiliary pattern is a graphic shown in FIG. 7. That is to say, the graphic is a graphic for which a pattern identifier for identifying the auxiliary pattern has been acquired by the judging unit 13. The graphic classification condition in this case is, for example, as follows.

(Graphic classification condition) The graphic width is 200 or smaller and is constant.

Figure 12:
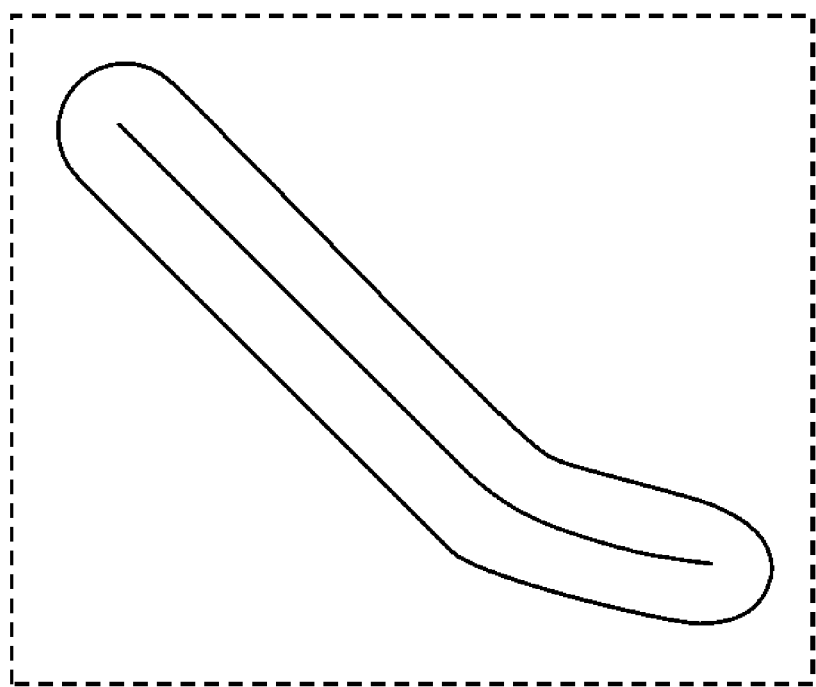
FIG. 12 is a view showing an exemplary center line in the Embodiment.

First, the center line acquiring part 141 acquires a center line of the graphic in FIG. 7, as shown in FIG. 12, using the input graphic information representing the graphic in FIG. 7. The example of acquiring the center line is as in the Example, and, thus, a description thereof has been omitted.

Figure 13:
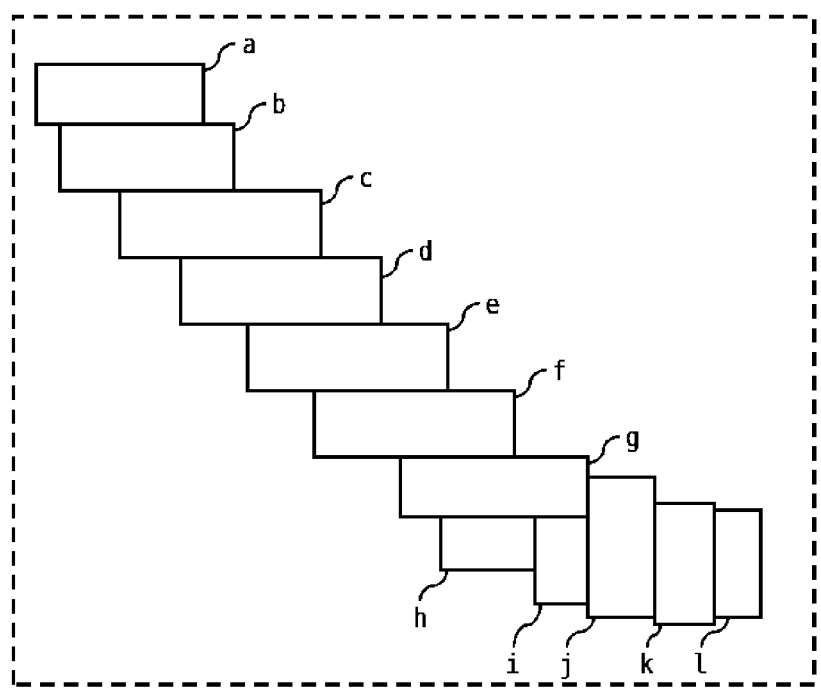
FIG. 13 is a view showing an exemplary approximate graphic in the Embodiment.

Next, the generating part 143 arranges one or more rectangles along the center line in FIG. 12. In that case, the generating part 143 sequentially arranges rectangles from the upper end of the center line in FIG. 12 toward the lower end. In that case, the generating part 143 arranges each rectangle such that the center, any one of the four vertices, or any one of the four midpoints of the sides of the rectangle that is to be arranged is on the center line. In that case, the generating part 143 arranges rectangles such that the rectangles do not overlap each other. In that case, the generating part 143 determines the size of a rectangle that is to be arranged next, according to the size of the arranged rectangle, the arranged position, the distance between two points that are intersections between a straight line in the horizontal direction and the contour of the graphic at the arranged position, and the like. FIG. 13 shows an example of an approximate graphic generated by the generating part 143 as a result of the arrangement.

In FIG. 12, the generating part 143 first arranges a rectangle (a rectangle a in FIG. 13) that circumscribes the upper end of the graphic. The lateral width of the rectangle a is, for example, the distance between two points that are intersections between the contour of the graphic in FIG. 12 and a straight line in the horizontal direction. Furthermore, the longitudinal width of the rectangle is determined, for example, such that a difference between the original graphic and the approximate graphic satisfies the difference condition and such that the total number of rectangles is the smallest. Next, the generating part 143 arranges a rectangle b in FIG. 13 adjacent to the rectangle a in FIG. 13. The lateral width and the longitudinal width of the rectangle b are, for example, similar to the lateral width and the longitudinal width of the rectangle a. Next, the generating part 143 sequentially arranges rectangles c, d, e, f, g, h, i, j, k, and l in FIG. 13, in a manner similar to that of the rectangle b in FIG. 13.

Figure 14:
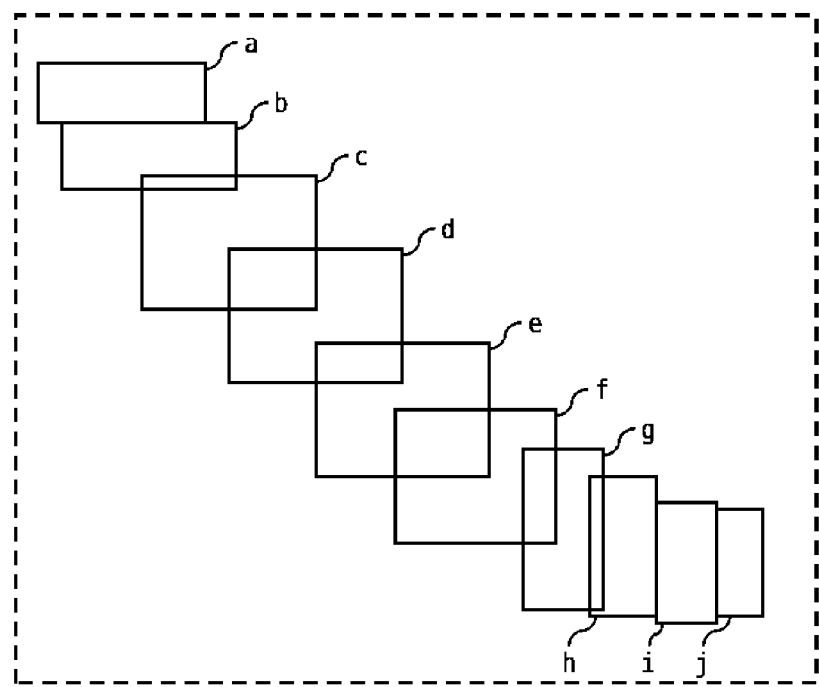
FIG. 14 is a view showing an exemplary approximate graphic in the Embodiment.

FIG. 14 shows an example of an approximate graphic generated by the generating part 143 as a result of performing the arrangement such that the rectangles overlap each other. In FIG. 12, the generating part 143 first arranges a rectangle (a rectangle a in FIG. 14) that circumscribes the upper end of the graphic. The lateral width of the rectangle a is, for example, the distance between two points that are intersections between the contour of the graphic in FIG. 12 and a straight line in the horizontal direction. Furthermore, the longitudinal width of the rectangle is selected, for example, at random within a predetermined range of the longitudinal width. Next, the generating part 143 arranges a rectangle b in FIG. 14 adjacent to the rectangle a in FIG. 14. The lateral width and the longitudinal width of the rectangle b are, for example, similar to the lateral width and the longitudinal width of the rectangle a. Next, the generating part 143 arranges a rectangle c in FIG. 14 that overlaps the rectangle b in FIG. 14. The lateral width of the rectangle c is, for example, similar to the lateral width of the rectangle b. Furthermore, the longitudinal width of the rectangle c is, for example, twice the longitudinal width of the rectangle b. Next, the generating part 143 sequentially arranges rectangles d, e, f, g, h, i, and j, in a manner similar to that of the rectangle c in FIG. 14.

Further Example

In this Further Example, an operation that generates an approximate graphic corresponding to a graphic corresponding to the first main pattern will be described. In this Further Example, it is assumed that the graphic corresponding to the first main pattern is a graphic shown in FIG. 15. That is to say, the graphic is a graphic for which a pattern identifier for identifying the main pattern and a pattern identifier for identifying the first main pattern have been acquired by the judging unit 13. The graphic classification condition in this case is, for example, as follows. Furthermore, the maximum shot size in this case is, for example, as follows.

(Graphic classification condition) The graphic width is larger than 200.

(Maximum shot size) 250×250

Figure 15:
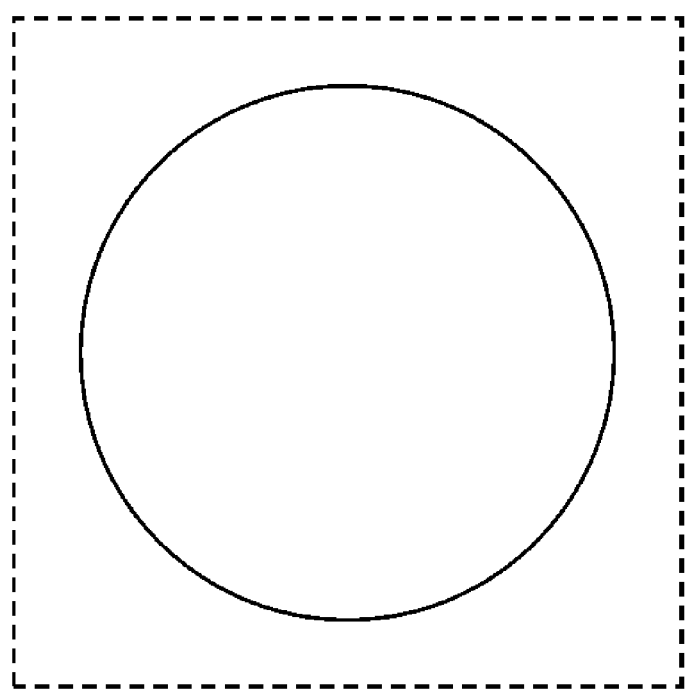
FIG. 15 is a view showing an exemplary graphic corresponding to a first main pattern and a second main pattern in the Embodiment.
Figure 16:
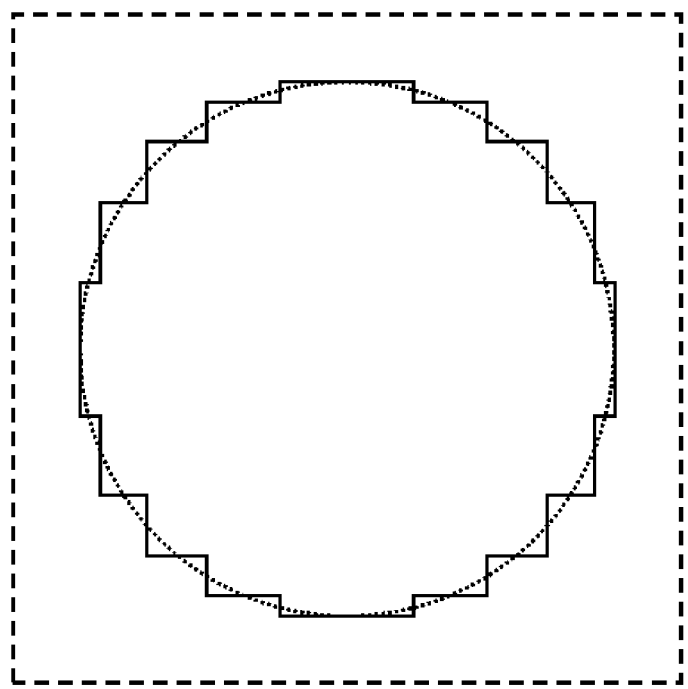
FIG. 16 is a view showing an exemplary approximate contour in the Embodiment.

First, the approximate contour acquiring part 142 quantizes the contour of the graphic in FIG. 15, as shown in FIG. 16, using the input graphic information representing the graphic in FIG. 15, thereby acquiring an approximate contour of the graphic. In FIG. 16, the dotted line represents the contour of the graphic in FIG. 15.

Figure 17:
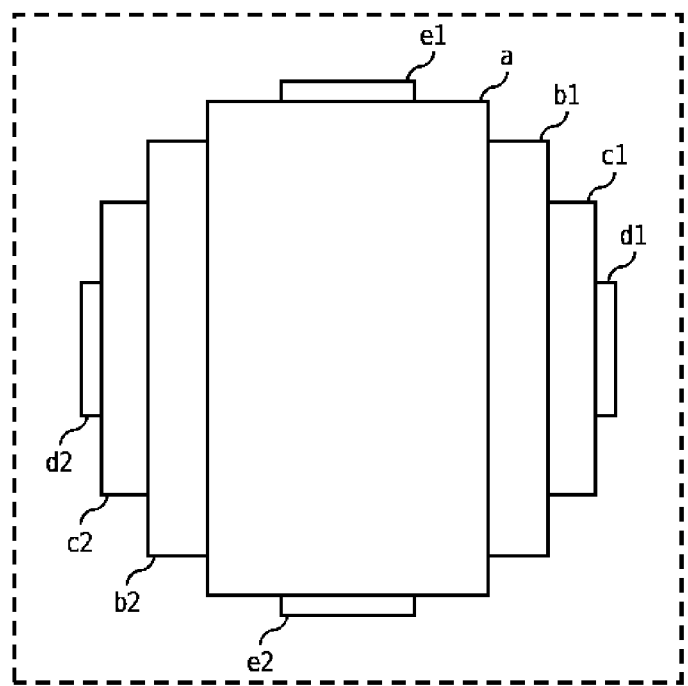
FIG. 17 is a view showing an exemplary approximate graphic in the Embodiment.

Next, the generating part 143 arranges one or more rectangles having a size that is the maximum shot size or smaller, along the contour in FIG. 16. FIG. 17 shows an example of an approximate graphic generated by the generating part 143 as a result of the arrangement. In FIG. 16, the generating part 143 first arranges a rectangle (a rectangle a in FIG. 17) that has a size that is the maximum shot size or smaller, and that is the largest rectangle that can be enclosed within the contour in FIG. 16. Next, the generating part 143 arranges, in a region inside the contour in FIG. 16 where no rectangle has been arranged, a rectangle that is a rectangle adjacent to the rectangle a in FIG. 17, and that is the largest rectangle that can be arranged within the region. The rectangle is a rectangle b1 and a rectangle b2 in FIG. 17. Next, the generating part 143 sequentially arranges rectangles c1, c2, d1, and d2 in FIG. 17, in a manner similar to that of the rectangles b1 and b2 in FIG. 17. Lastly, the generating part 143 arranges rectangles e1 and e2 in FIG. 17.

Another Further Example

In this Another Further Example, an operation that generates an approximate graphic corresponding to a graphic corresponding to the second main pattern will be described. In this Another Further Example, it is assumed that the graphic corresponding to the second main pattern is a graphic shown in FIG. 15. That is to say, the graphic is a graphic for which a pattern identifier for identifying the main pattern and a pattern identifier for identifying the second main pattern have been acquired by the judging unit 13. The graphic classification condition in this case is, for example, as follows. Furthermore, the maximum shot size in this case is, for example, as follows.

(Graphic classification condition) The graphic width is larger than 200.

(Maximum shot size) 250×250

First, the approximate contour acquiring part 142 quantizes the contour of the graphic in FIG. 15, as shown in FIG. 16, using the input graphic information representing the graphic in FIG. 15, thereby acquiring an approximate contour of the graphic. In FIG. 16, the dotted line represents the contour of the graphic in FIG. 15.

Figure 18:
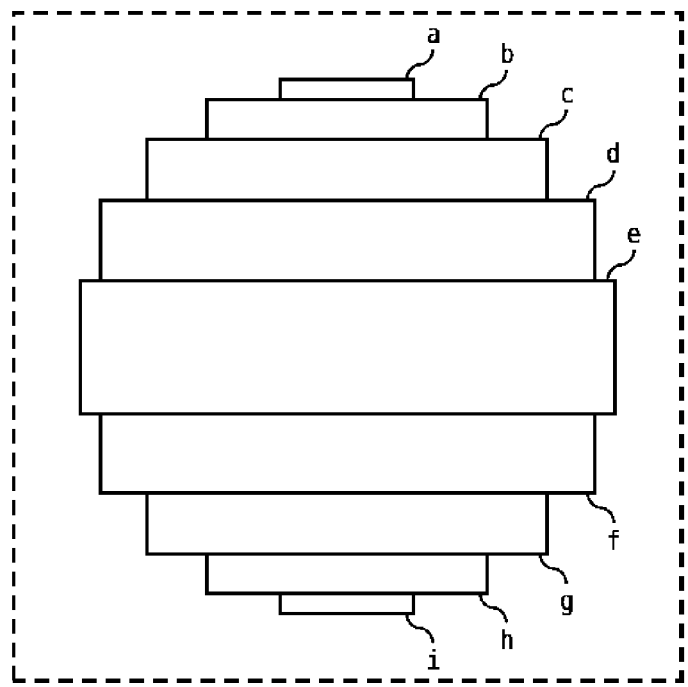
FIG. 18 is a view showing an exemplary approximate graphic in the Embodiment.

Next, the generating part 143 divides, along horizontal straight lines forming the contour, the graphic represented by the contour in FIG. 16, sequentially from the top, into rectangles. FIG. 18 shows an example of an approximate graphic generated by the generating part 143 as a result of the dividing. In FIG. 16, the generating part 143 first divides the graphic represented by the contour along a second horizontal straight line from the top. As a result, a rectangle a in FIG. 18 is generated. Next, the generating part 143 divides the graphic represented by the contour along a third horizontal straight line from the top of the contour in FIG. 16. As a result, a rectangle b in FIG. 18 is generated. Next, the generating part 143 sequentially divides the graphic represented by the contour in FIG. 16, in a manner similar to that of the rectangles a and b in FIG. 18. As a result, rectangles c to i in FIG. 18 are generated. In this Another Further Example, the graphic size in FIG. 15 is the maximum shot size or smaller, and, thus, it is natural that the size of each rectangle in FIG. 18 is the maximum shot size or smaller.

As described above, the electron beam drawing apparatus 1 of this Embodiment can reduce the total number of rectangles at the time of fracturing, and shorten the drawing time.

Another Embodiment

In this Another Embodiment, a drawing graphic data generating apparatus 2 that generates approximate graphic information representing one or more graphics that approximate one or more graphics, using a rectangle, will be described.

Figure 19:
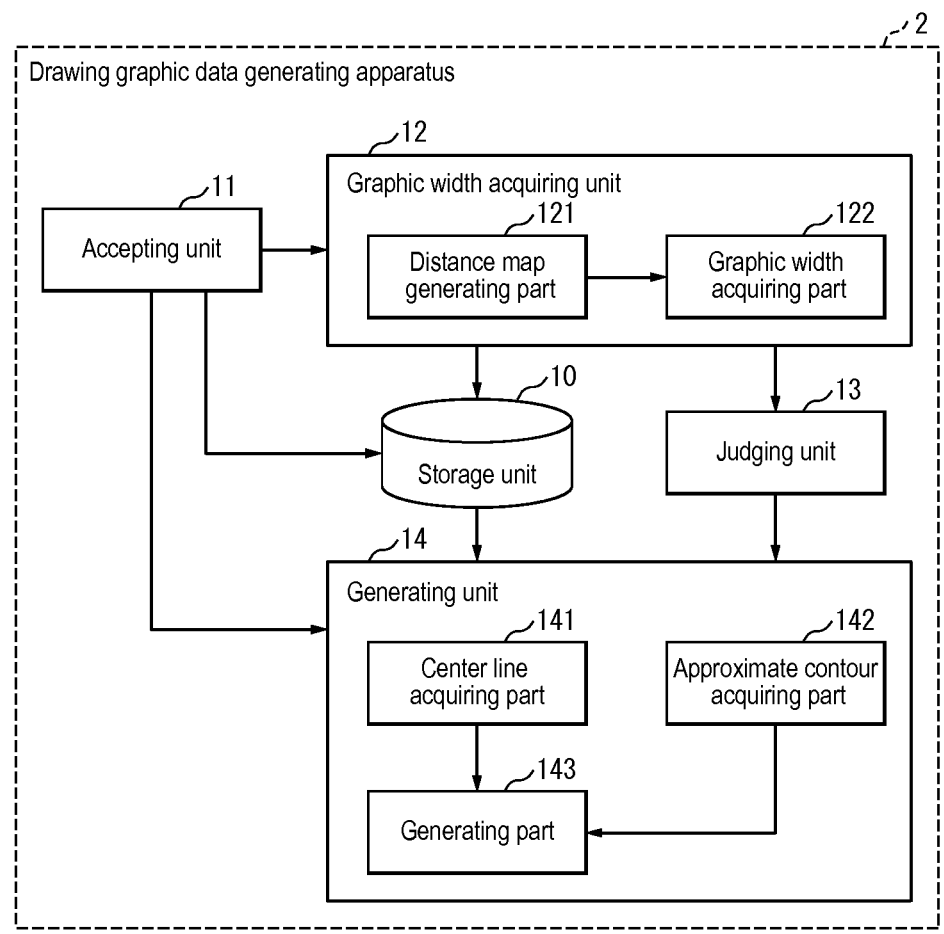
FIG. 19 is a block diagram of a drawing graphic data generating apparatus 2 in Another Embodiment.

FIG. 19 is a block diagram of the drawing graphic data generating apparatus 2 in the Another Embodiment. The drawing graphic data generating apparatus 2 includes the accepting unit 11, the graphic width acquiring unit 12, the judging unit 13, and the generating unit 14. Furthermore, the graphic width acquiring unit 12 includes the distance map generating part 121 and the graphic width acquiring part 122. Furthermore, the generating unit 14 includes the center line acquiring part 141, the approximate contour acquiring part 142, and the generating part 143.

The approximate graphic information generated by the drawing graphic data generating apparatus 2 is transmitted to an apparatus that draws a graphic (e.g., the electron beam drawing apparatus 1 in the Embodiment) and the like. The apparatus that has received the approximate graphic information draws one or more graphics represented by the approximate graphic information.

The flowchart illustrating the outline of an operation of the drawing graphic data generating apparatus 2 is the same as that in FIG. 4, except for the process in step S412, and, thus, a description thereof has been omitted.

Furthermore, specific examples of the operation of the drawing graphic data generating apparatus 2 are the same as those in the Embodiment, and, thus, a description thereof has been omitted.

Furthermore, the electron beam drawing apparatus in the foregoing embodiments may be, for example, either a standalone apparatus or a server apparatus in a server-client system.

Furthermore, in the foregoing embodiments, each processing or each function may be realized as integrated processing using a single apparatus or a single system, or may be realized as distributed processing using multiple apparatuses or multiple systems.

Furthermore, in the foregoing embodiments, each constituent element may be configured by dedicated hardware, or alternatively, constituent elements that can be realized as software may be realized by executing a program. For example, each constituent element may be realized by a program execution unit such as a CPU reading and executing a software program stored in a storage medium such as a hard disk or a semiconductor memory.

The software that realizes the electron beam drawing apparatus in the foregoing embodiments may be the following sort of program. Specifically, this program is a program for causing a computer to function as: an accepting unit that accepts input graphic information, which is information representing at least one graphic; a graphic width acquiring unit that acquires a width of each of the at least one graphic represented by the input graphic information; a generating unit that generates approximate graphic information representing at least one approximate graphic, which is a graphic configured by at least one rectangle matching the width of the graphic, and is a graphic that approximates each of the at least one graphic represented by the input graphic information; and a drawing unit that draws the at least one approximate graphic represented by the approximate graphic information generated by the generating unit.

The software that realizes the drawing graphic data generating apparatus in the foregoing embodiments may be the following sort of program. Specifically, this program is a program for causing a computer to function as: an accepting unit that accepts input graphic information, which is information representing at least one graphic; a graphic width acquiring unit that acquires a width of each of the at least one graphic represented by the input graphic information; and a generating unit that generates approximate graphic information representing at least one approximate graphic, which is a graphic configured by at least one rectangle matching the width of the graphic, and is a graphic that approximates each of the at least one graphic represented by the input graphic information.

It should be noted that, in the programs, the functions realized by the programs do not include functions that can be realized only by hardware.

Furthermore, the programs may be executed by downloading from a server or the like, or may be executed by reading a program stored in a predetermined storage medium (e.g., an optical disk such as a CD-ROM, a magnetic disk, a semiconductor memory, etc.). Furthermore, the program may be used as a program forming a program product.

Furthermore, the computer that executes this program may be a single computer, or may be multiple computers.

That is to say, centralized processing may be performed, or distributed processing may be performed.

Figure 21:
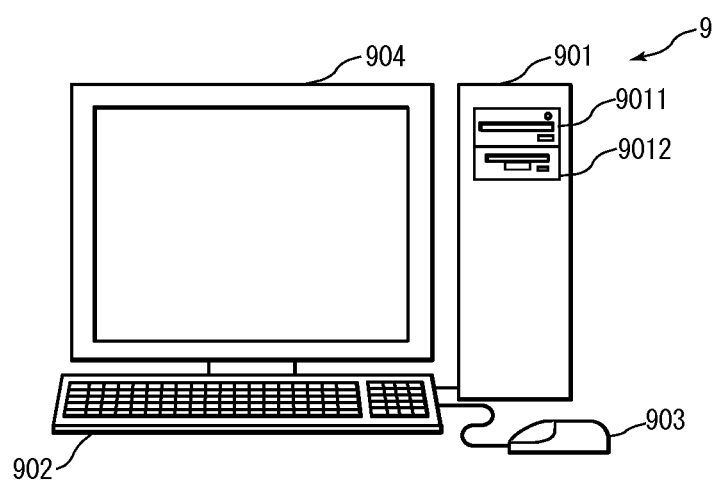
FIG. 21 is a schematic view of a computer system in the Another Embodiment.

FIG. 21 is a schematic view showing a computer system 9 that executes the programs described above to realize the electron beam drawing apparatus and the like in the foregoing embodiments. The foregoing embodiments may be realized using computer hardware and computer programs executed thereon.

In FIG. 21, the computer system 9 is provided with a computer 901 including a CD-ROM drive 9011 and an FD drive 9012, a keyboard 902, a mouse 903, and a monitor 904.

Figure 22:
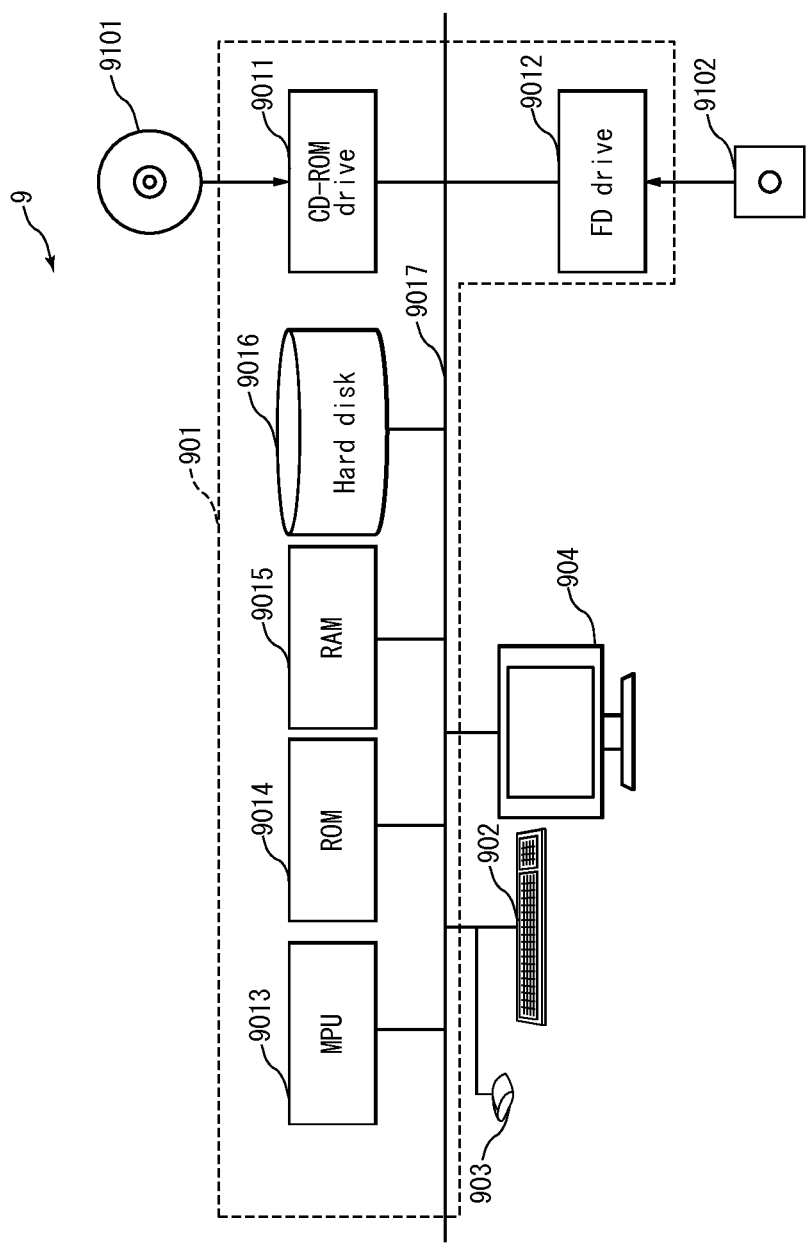
FIG. 22 is a block diagram of the computer system in the Another Embodiment.

FIG. 22 is a block diagram of the computer system 9. In FIG. 22, the computer 901 is provided with, in addition to the CD-ROM drive 9011 and the FD drive 9012, an MPU 9013, a ROM 9014 in which a program such as a boot up program is to be stored, an RAM 9015 that is connected to the MPU 9013 and in which a command of an application program is temporarily stored, and a temporary storage area is to be provided, a hard disk 9016 in which an application program, a system program, and data are stored, and a bus 9017 that connects the CD-ROM drive 9011, the FD drive 9012, the MPU 9013, and the like. Although not shown, the computer 901 may further include a network card for providing a connection to a LAN.

The program for causing the computer system 9 to execute the functions of the electron beam drawing apparatus and the like in the foregoing embodiments may be stored in a CD-ROM 9101 or an FD 9102 that is inserted into the CD-ROM drive 9011 or the FD drive 9012, and be transmitted to the hard disk 9016. Alternatively, the program may be transmitted via an unshown network to the computer 901 and stored in the hard disk 9016. At the time of execution, the program is loaded into the RAM 9015. The program may be loaded from the CD-ROM 9101 or the FD 9102, or directly from a network.

The program does not necessarily have to include, for example, an operating system (OS) or a third party program to cause the computer 901 to execute the functions of the electron beam drawing apparatus and the like in the foregoing embodiments. The program may only include a command portion to call an appropriate function (module) in a controlled mode and obtain desired results. The manner in which the computer system 9 operates is well known, and, thus, a detailed description thereof has been omitted.

The present invention is not limited to the embodiments set forth herein. Various modifications are possible within the scope of the present invention.

As described above, the electron beam drawing apparatus according to the present invention has an effect that the apparatus can reduce the total number of rectangles at the time of fracturing, and shorten the drawing time, and, thus, this apparatus is useful as various electron beam drawing apparatuses and the like for drawing a graphic on a photomask, a wafer, or the like.

The invention claimed is:

1. An electron beam drawing apparatus, comprising:
a storage unit in which at least two pieces of pattern management information, each of which is information in which a graphic classification condition regarding the width of a graphic and a pattern identifier for identifying a predetermined pattern based on the width of the graphic are associated with each other, are stored, wherein the at least two pieces of pattern management information include pattern management information having an auxiliary pattern identifier for identifying an auxiliary pattern and pattern management information having a main pattern identifier for identifying a main pattern, wherein the auxiliary pattern is a graphic pattern whose graphic width is small enough to satisfy the graphic classification condition, and wherein the main pattern is a graphic pattern whose graphic width is large enough to satisfy the graphic classification condition;
an accepting unit that accepts input graphic information, which is information representing at least one graphic;
a graphic width acquiring unit that acquires a width of each of the at least one graphic represented by the input graphic information;
a generating unit that generates approximate graphic information representing at least one approximate graphic configured by at least one rectangle matching the width of the at least one graphic represented by the input graphic information and that approximates each of the at least one graphic represented by the input graphic information;
a drawing unit that draws the at least one approximate graphic represented by the approximate graphic information generated by the generating unit; and
a judging unit that acquires a pattern identifier associated with a respective graphic classification condition satisfied by the width of the graphic,
wherein, in a case where the judging unit acquires a pattern identifier for identifying the auxiliary pattern, the generating unit acquires a center line of each of the at least one graphic and generates approximate graphic information representing at least one approximate graphic that approximates at least one graphic corresponding to the auxiliary pattern, by arranging at least one rectangle matching a width of the graphic, along the center line, and
wherein, in a case where the judging unit acquires the pattern identifier for identifying the main pattern, the generating unit acquires an approximate contour that is a contour of a graphic corresponding to the main pattern and is a contour configured by a horizontal straight line, a vertical straight line, and a straight line at a predetermined angle, and generates approximate graphic information representing at least one approximate graphic that approximates at least one graphic corresponding to the main pattern, by arranging at least one rectangle matching a shape of the graphic represented by the approximate contour.

2. The electron beam drawing apparatus according to claim 1,
wherein, in the storage unit, a maximum shot size, a first main pattern identifier for identifying a first main pattern that is a graphic pattern whose graphic size is larger than the maximum shot size, and a second main pattern identifier for identifying a second main pattern that is a graphic pattern whose graphic size is the maximum shot size or smaller, are further stored,
wherein the judging unit judges whether or not a size of each of at least one graphic corresponding to the main pattern is larger than the maximum shot size, and acquires the first main pattern identifier for identifying the first main pattern, in a case where the size is larger than the maximum shot size, and acquires the second pattern identifier for identifying the second main pattern, in a case where the size is the maximum shot size or smaller,
wherein, in a case where the judging unit acquires the pattern identifier for identifying the first main pattern, the generating unit acquires an approximate contour that is a contour of a graphic corresponding to the first main pattern and is a contour configured by a horizontal straight line, a vertical straight line, and a straight line at a predetermined angle, and generates approximate graphic information representing at least one approximate graphic that approximates at least one graphic corresponding to the first main pattern, by arranging at least one rectangle matching a shape of the graphic represented by the approximate contour, and wherein, in a case where the judging unit acquires the pattern identifier for identifying the second main pattern, the generating unit acquires an approximate contour that is a contour of a graphic corresponding to the second main pattern and is a contour configured by a horizontal straight line, a vertical straight line, and a straight line at a predetermined angle, and generates approximate graphic information representing at least one approximate graphic that approximates at least one graphic corresponding to the second main pattern, by dividing the graphic represented by the approximate contour, along the approximate contour, into at least two rectangles.

3. The electron beam drawing apparatus according to claim 1, wherein in the case where the judging unit acquires the pattern identifier for identifying the auxiliary pattern, the generating unit generates the approximate graphic information representing the at least one approximate graphic that approximates the at least one graphic corresponding to the auxiliary pattern, by arranging the at least one rectangle matching the width of the graphic, along the center line, such that the rectangles do not overlap each other.

4. The electron beam drawing apparatus according to claim 1, wherein in the case where the judging unit acquires the pattern identifier for identifying the auxiliary pattern, the generating unit generates the approximate graphic information representing the at least one approximate graphic that approximates the at least one graphic corresponding to the auxiliary pattern, by arranging the at least one rectangle matching the width of the graphic, along the center line, such that the rectangles overlap each other.

5. An electron beam drawing method performed using a storage unit, an accepting unit, a graphic width acquiring unit, a generating unit, a drawing unit, and a judging unit, comprising:

a storing step of the storage unit storing at least two pieces of pattern management information, each of which is information in which a graphic classification condition regarding the width of a graphic and a pattern identifier for identifying a predetermined pattern based on the width of the graphic are associated with each other, wherein the at least two pieces of pattern management information include pattern management information having an auxiliary pattern identifier for identifying an auxiliary pattern and pattern management information having a main pattern identifier for identifying a main pattern, wherein the auxiliary pattern is a graphic pattern whose graphic width is small enough to satisfy the graphic classification condition, and wherein the main pattern is a graphic pattern whose graphic width is large enough to satisfy the graphic classification condition;

an accepting step of the accepting unit accepting input graphic information, which is information representing at least one graphic;

a graphic width acquiring step of the graphic width acquiring unit acquiring a width of each of the at least one graphic represented by the input graphic information;

a generating step of the generating unit generating approximate graphic information representing at least one approximate graphic configured by at least one rectangle matching the width of the at least one graphic represented by the input graphic information and that approximates each of the at least one graphic represented by the input graphic information;

a drawing step of the drawing unit drawing the at least one approximate graphic represented by the approximate graphic information generated by the generating unit; and a judging step of the judging unit acquiring a pattern identifier associated with a respective graphic classification condition satisfied by the width of the graphic, wherein, in a case where the judging unit acquires the pattern identifier for identifying the auxiliary pattern, the generating unit acquires a center line of each of the at least one graphic and generates approximate graphic information representing at least one approximate graphic that approximates at least one graphic corresponding to the auxiliary pattern, by arranging at least one rectangle matching a width of the graphic, along the center line, and wherein, in a case where the judging unit acquires the pattern identifier for identifying the main pattern, the generating unit acquires an approximate contour that is a contour of a graphic corresponding to the main pattern and is a contour configured by a horizontal straight line, a vertical straight line, and a straight line at a predetermined angle, and generates approximate graphic information representing at least one approximate graphic that approximates at least one graphic corresponding to the main pattern, by arranging at least one rectangle matching a shape of the graphic represented by the approximate contour.

6. A non-transitory computer-readable storage medium in which a program is stored, the program causing a computer to function as:

a storage unit that stores at least two pieces of pattern management information, each of which is information in which a graphic classification condition regarding the width of a graphic and a pattern identifier for identifying a predetermined pattern based on the width of the graphic are associated with each other, wherein the at least two pieces of pattern management information include pattern management information having an auxiliary pattern identifier for identifying an auxiliary pattern and pattern management information having a main pattern identifier for identifying a main pattern, wherein the auxiliary pattern is a graphic pattern whose graphic width is small enough to satisfy the graphic classification condition, and wherein the main pattern is a graphic pattern whose graphic width is large enough to satisfy the graphic classification condition;

an accepting unit that accepts input graphic information, which is information representing at least one graphic;

a graphic width acquiring unit that acquires a width of each of the at least one graphic represented by the input graphic information;

a generating unit that generates approximate graphic information representing at least one approximate graphic, which is a graphic configured by at least one rectangle matching the width of the graphic, and is a graphic that approximates each of the at least one graphic represented by the input graphic information;

a drawing unit that draws the at least one approximate graphic represented by the approximate graphic information generated by the generating unit; and a judging unit that acquires a pattern identifier associated with a respective graphic classification condition satisfied by the width of the graphic, wherein, in a case where the judging unit acquires the pattern identifier for identifying the auxiliary pattern, the generating unit acquires a center line of each of the at least one graphic and generates approximate graphic information representing at least one approximate graphic that approximates at least one graphic corresponding to the auxiliary pattern, by arranging at least one rectangle matching a width of the graphic, along the center line, and wherein, in a case where the judging unit acquires the pattern identifier for identifying the main pattern, the generating unit acquires an approximate contour that is a contour of a graphic corresponding to the main pattern and is a contour configured by a horizontal straight line, a vertical straight line, and a straight line at a predetermined angle, and generates approximate graphic information representing at least one approximate graphic that approximates at least one graphic corresponding to the main pattern, by arranging at least one rectangle matching a shape of the graphic represented by the approximate contour.

* * * * *